(12) United States Patent
Leng et al.

(10) Patent No.: US 12,136,884 B2
(45) Date of Patent: Nov. 5, 2024

(54) POWER CONVERTER

(71) Applicant: Delta Electronics, Inc., Taoyuan (TW)

(72) Inventors: Yang Leng, Taoyuan (TW);
Zhongwang Yang, Taoyuan (TW);
Yankai Liu, Taoyuan (TW); Wenhua Li, Taoyuan (TW); Wei Tang, Taoyuan (TW)

(73) Assignee: Delta Electronics, Inc., Taoyuan (TW)

( * ) Notice: Subject to any disclaimer, the term of this patent is extended or adjusted under 35 U.S.C. 154(b) by 286 days.

(21) Appl. No.: 17/727,071

(22) Filed: Apr. 22, 2022

(65) Prior Publication Data

US 2022/0352826 A1 Nov. 3, 2022

(30) Foreign Application Priority Data

Apr. 30, 2021 (CN) .......................... 202110481021.X

(51) Int. Cl.
*H02M 3/335* (2006.01)
*H01F 27/255* (2006.01)
*H01F 27/30* (2006.01)
*H05K 1/18* (2006.01)

(52) U.S. Cl.
CPC ...... *H02M 3/33571* (2021.05); *H01F 27/255* (2013.01); *H01F 27/306* (2013.01); *H05K 1/181* (2013.01); *H05K 2201/10015* (2013.01); *H05K 2201/10166* (2013.01)

(58) Field of Classification Search
CPC .............. H02M 3/33571; H01F 27/255; H01F 27/306; H05K 1/181; H05K 2201/10051; H05K 2201/10166
See application file for complete search history.

(56) References Cited

U.S. PATENT DOCUMENTS

| 2019/0006356 A1 | 1/2019 | Lim et al. | |
| 2024/0047126 A1* | 2/2024 | Jin | H02M 3/33576 |
| 2024/0116375 A1* | 4/2024 | Asa | H02M 7/003 |
| 2024/0136926 A1* | 4/2024 | Hosotani | H02M 3/155 |

FOREIGN PATENT DOCUMENTS

| CN | 202344105 U | * | 7/2012 | |
| CN | 204068808 U | | 12/2014 | |
| CN | 113013152 A | | 6/2021 | |
| JP | 2003348881 A | * | 12/2003 | H02P 6/085 |

* cited by examiner

*Primary Examiner* — Adolf D Berhane
(74) *Attorney, Agent, or Firm* — KIRTON McCONKIE; Evan R. Witt

(57) ABSTRACT

The present disclosure provides a power converter including a first capacitor, a second capacitor, and a power module. The first capacitor and the second capacitor are connected in series. The power module is electrically connected to the first capacitor and the second capacitor and includes a circuit board, an absorption capacitor, a primary switch circuit, a magnetic component, and a secondary circuit. The absorption capacitor, the primary switch circuit, the magnetic component and the secondary circuit are disposed on the circuit board. A primary winding and a secondary winding of the magnetic component are electrically connected to the primary switch circuit and the secondary circuit respectively.

32 Claims, 22 Drawing Sheets

POWER CONVERTER

CROSS-REFERENCE TO RELATED APPLICATION

This application claims priority to China Patent Application No. 202110481021.X, filed on Apr. 30, 2021, the entire contents of which are incorporated herein by reference for all purposes.

FIELD OF THE INVENTION

The present disclosure relates to the field of power electronics technology, and more particularly to a power converter.

BACKGROUND OF THE INVENTION

In data centers using high-power racks, 48V DC buses are generally used. The single-stage converter module with transformer can directly convert the 48V voltage to the low voltage utilized by processors like CPU or GPU, and the single-stage converter module has high efficiency. In some applications with the CPU mounted reversely or the CPU co-packaged, the single-stage converter module also has to meet the extreme requirements of high power density and low module height (e.g., less than 3 mm). However, limited by the height of the capacitors in the converter module, it is difficult for the height of the whole converter module to meet the requirement of low module height.

Therefore, there is a need of providing a power converter in order to overcome the drawbacks of the conventional technologies.

SUMMARY OF THE INVENTION

The present disclosure provides a power converter, which reduces the height of the power converter and improves the power density of the power module by disposing at least part of the capacitors separately from the power module.

In accordance with an aspect of the present disclosure, a power converter is provided. The power converter includes a first capacitor, a second capacitor, and a power module. The first capacitor and the second capacitor are connected in series. The power module is electrically connected to the first capacitor and the second capacitor and includes a circuit board, an absorption capacitor, a primary switch circuit, a magnetic component, and a secondary circuit. The absorption capacitor, the primary switch circuit, the magnetic component and the secondary circuit are disposed on the circuit board. A primary winding and a secondary winding of the magnetic component are electrically connected to the primary switch circuit and the secondary circuit respectively.

In accordance with another aspect of the present disclosure, a power converter is provided. The power converter includes a first capacitor, a second capacitor, a primary switch circuit, and a power module. The first capacitor and the second capacitor are connected in series. The primary switch circuit is connected to the first capacitor and the second capacitor in parallel. The power module is electrically connected to the first capacitor, the second capacitor, and the primary switch circuit and includes a circuit board, a magnetic component, and a secondary circuit. The magnetic component and the secondary circuit are disposed on the circuit board. A primary winding and a secondary winding of the magnetic component are electrically connected to the primary switch circuit and the secondary circuit respectively.

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
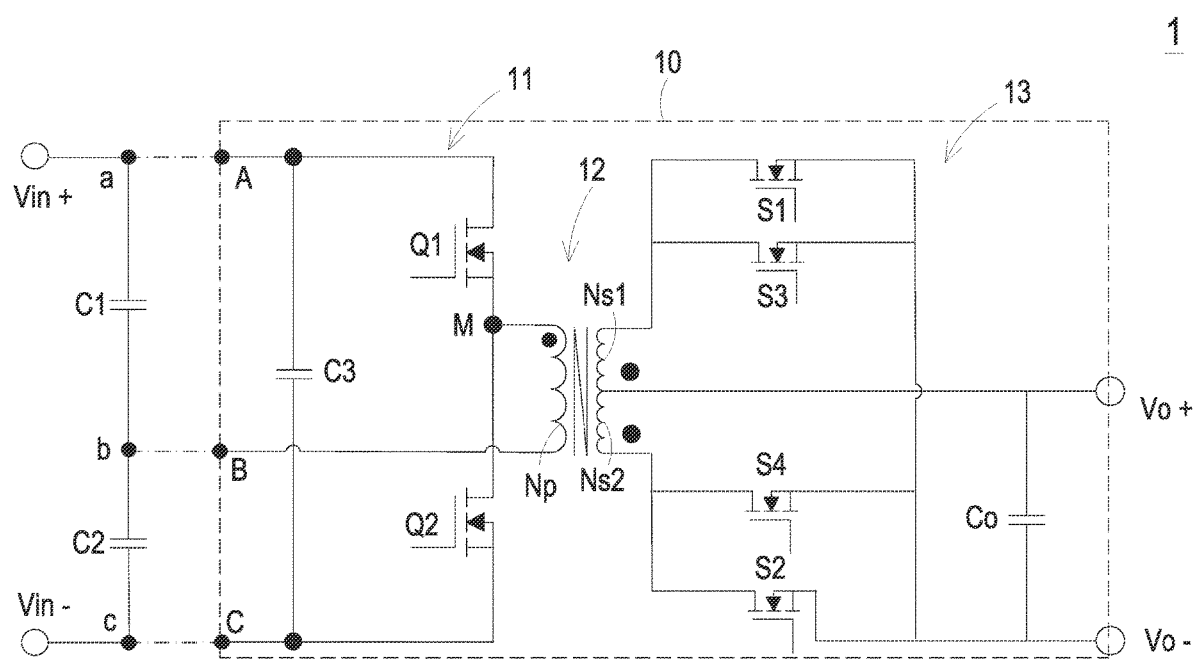
FIG. 1 is a schematic circuit diagram illustrating a power converter according to a first embodiment of the present disclosure.

FIG. 1 is a schematic circuit diagram illustrating a power converter according to a first embodiment of the present disclosure. As shown in FIG. 1, the power converter 1 receives an input voltage Vin through a positive input terminal Vin+ and a negative input terminal Vin−, and outputs an output voltage Vo through a positive output terminal Vo+ and a negative output terminal Vo−. The power converter 1 includes a first capacitor C1, a second capacitor C2 and a power module 10. The first capacitor C1 and the second capacitor C2 are configured to divide the input voltage Vin. The first capacitor C1 and the second capacitor C2 are connected in series. A first terminal of the first capacitor C1 and a first terminal of the second capacitor C2 are electrically connected to a first capacitor midpoint b, a second terminal a of the first capacitor C1 is electrically connected to the positive input terminal Vin+, and a second terminal c of the second capacitor C2 is electrically connected to the negative input terminal Vin−.

The power module 10 includes an absorption capacitor C3, a primary switch circuit 11, a magnetic component 12, and a secondary circuit 13, and the power module 10 has a first terminal A, a second terminal B, and a third terminal C. The first terminal A, the second terminal B, and the third terminal C of the power module 10 are electrically connected to the second terminal a of the first capacitor C1, the first capacitor midpoint b, and the second terminal c of the second capacitor C2 respectively. Two terminals of the absorption capacitor C3 are electrically connected to the first terminal A and the third terminal C of the power module 10 respectively. Two terminals of the primary switch circuit 11 are electrically connected to the first terminal A and the third terminal C of the power module 10 respectively. In other words, the absorption capacitor C3 and the primary switch circuit 11 are connected in parallel. The primary switch circuit 11 includes a first switch Q1 and a second switch Q2 connected in series, and there is a switch midpoint M between the first switch Q1 and the second switch Q2. The absorption capacitor C3 can absorb the voltage stress while turning on or off the first switch Q1 and the second switch Q2.

In this embodiment, the magnetic component 12 includes a primary winding Np, a first secondary winding Ns1, and a second secondary winding Ns2. Two terminals of the primary winding Np are electrically connected to the switch midpoint M and the second terminal B of the power module 10 respectively. The primary winding Np is electromagnetically coupled with the first secondary winding Ns1 and the second secondary winding Ns2. Each of the first secondary winding Ns1 and the second secondary winding Ns2 has a first terminal and a second terminal. The second terminal of the first secondary winding Ns1, the first terminal of the second secondary winding Ns2, and the first terminal of the primary winding Np are dotted terminals. The second terminal of the second secondary winding Ns2 is an undotted terminal. The second terminals of the first secondary winding Ns1 and the second secondary winding Ns2 are electrically connected to form a center tap point, and the center tap point is electrically connected to the positive output terminal Vo+.

In an embodiment, the secondary circuit 13 includes a first rectifier component and a second rectifier component. The first rectifier component is electrically connected between the first terminal of the first secondary winding Ns1 and the negative output terminal Vo−, and includes two first rectifier components S1 and S3 connected in parallel. The second rectifier component is electrically connected between the first terminal of the second secondary winding Ns2 and the negative output terminal Vo−, and includes two second rectifier components S2 and S4 connected in parallel. The rectifier components S1, S2, S3, and S4 are for example but not limited to MOSFETs (metal-oxide-semiconductor field-effect transistors) or diodes. The first terminals of the first rectifier components S1 and S3 and the first terminals of the second rectifier components S2 and S4 are electrically connected and are the same electrode (e.g., the source). The second terminals (e.g., the drains) of the first rectifier components S1 and S3 are electrically connected to the first terminal of the first secondary winding Ns1. The second terminals (e.g., the drains) of the second rectifier components S2 and S4 are electrically connected to the first terminal of the second secondary winding Ns2. Therefore, the first rectifier components S1 and S3, the second rectifier components S2 and S4, the first secondary winding Ns1, and the second secondary winding Ns2 form a closed loop.

Figure 2:
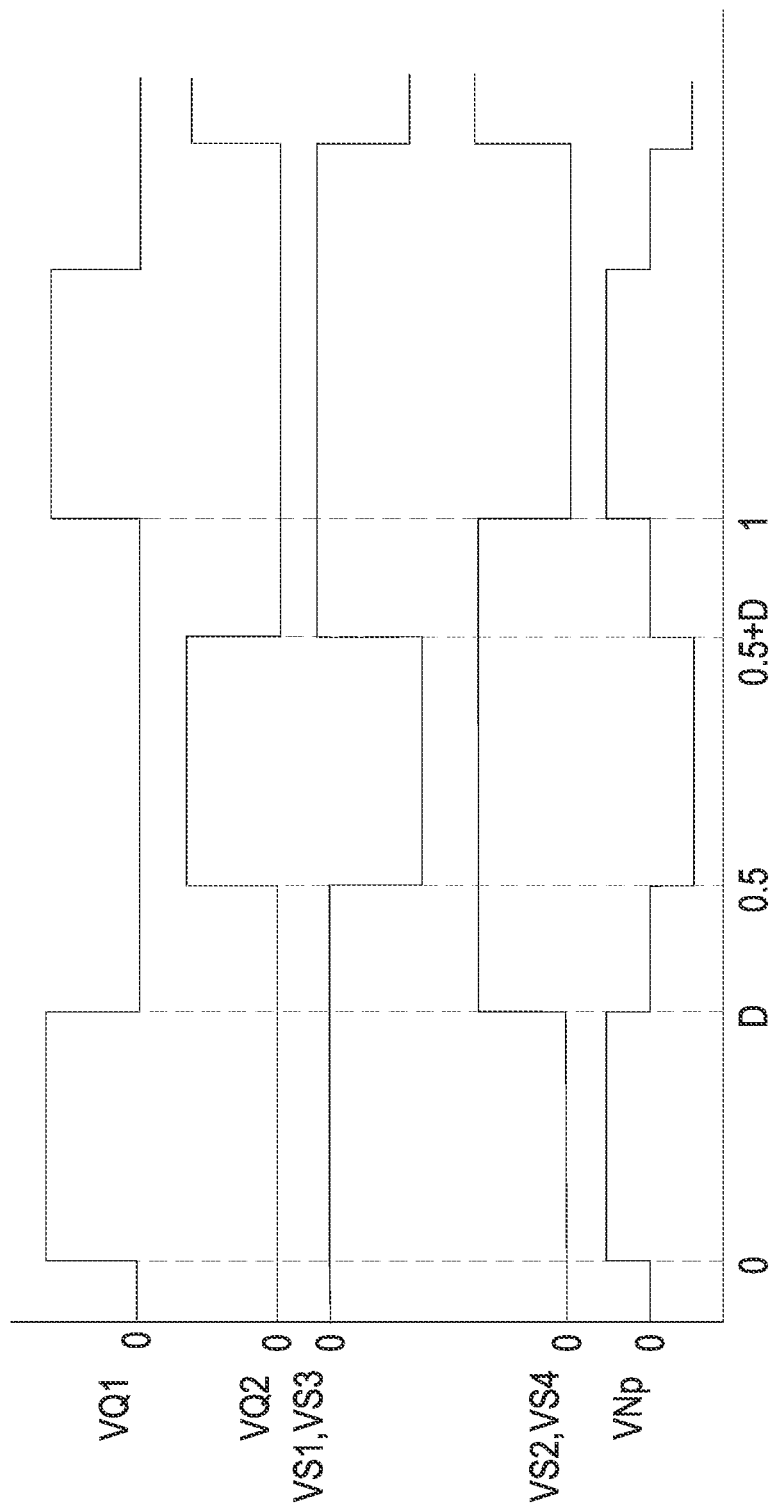
FIG. 2 schematically shows the driving time sequences of the switches and rectifier components in FIG. 1.

The driving time sequences of the switches and rectifier components in FIG. 1 are shown in FIG. 2. The driving signal VQ1 received by the first switch Q1 and the driving signal VQ2 received by the second switch Q2 have a phase difference of 180 degrees, and the turn-on duty cycles of the driving signals VQ1 and VQ2 (represented by D in FIG. 2) are approximately equal. In addition, the driving signals VS1 and VS3 received by the first rectifier components S1 and S3 are complementary to the driving signal VQ2, and the driving signals VS2 and VS4 received by the second rectifier components S2 and S4 are complementary to the driving signal VQ1. Moreover, the cross-over voltage VNp across the primary winding Np is a three-level AC voltage, namely the cross-over voltage VNp has three voltage levels, which are +Vin/2, 0, and −Vin/2 respectively. In an embodiment, when the turn-on duty cycles of the driving signals VQ1 and VQ2 are close or equal to 50%, the cross-over voltage VNp is a two-level AC voltage. Namely, the cross-over voltage VNp has two kinds of voltage levels, which are +Vin/2 and −Vin/2 respectively.

Figure 3:
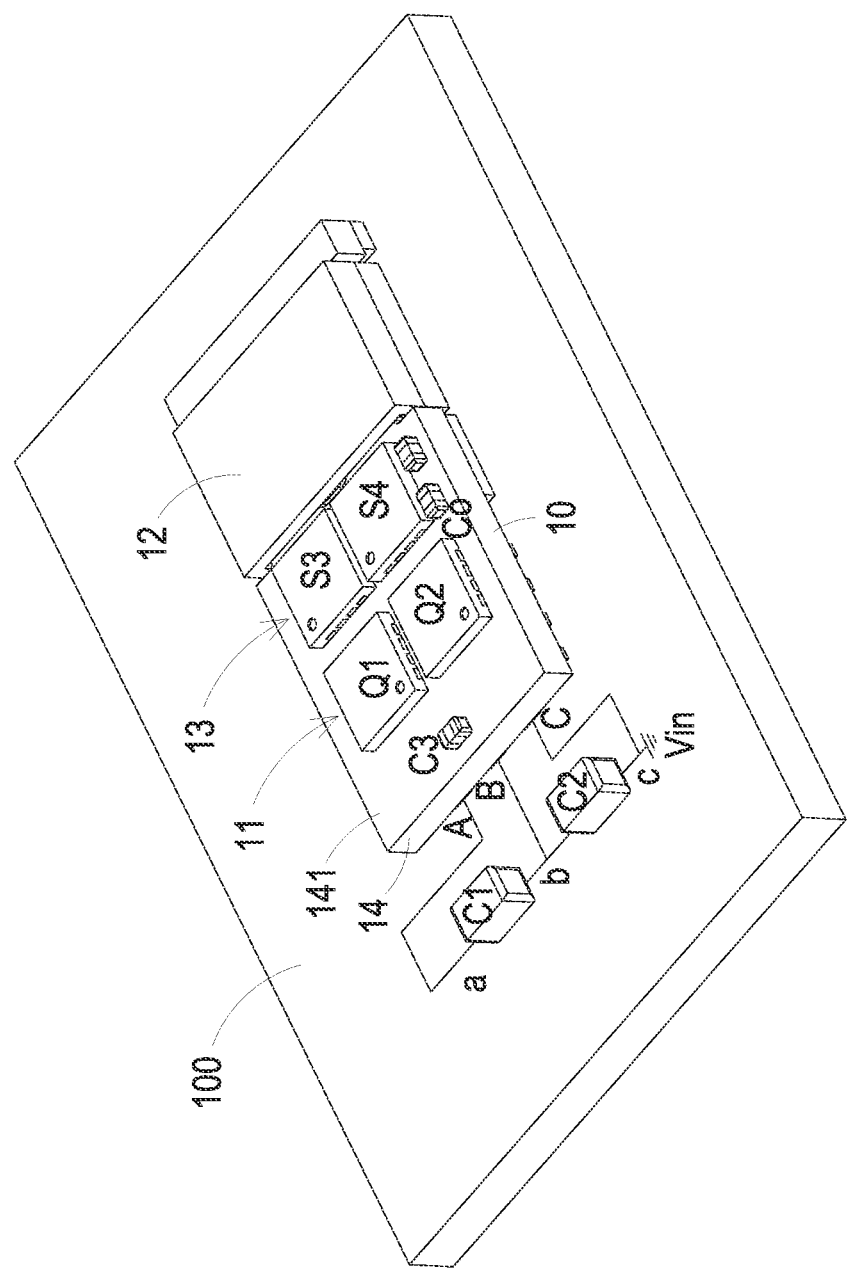
FIG. 3 is a schematic perspective view illustrating the power converter according to the first embodiment of the present disclosure.
Figure 4:
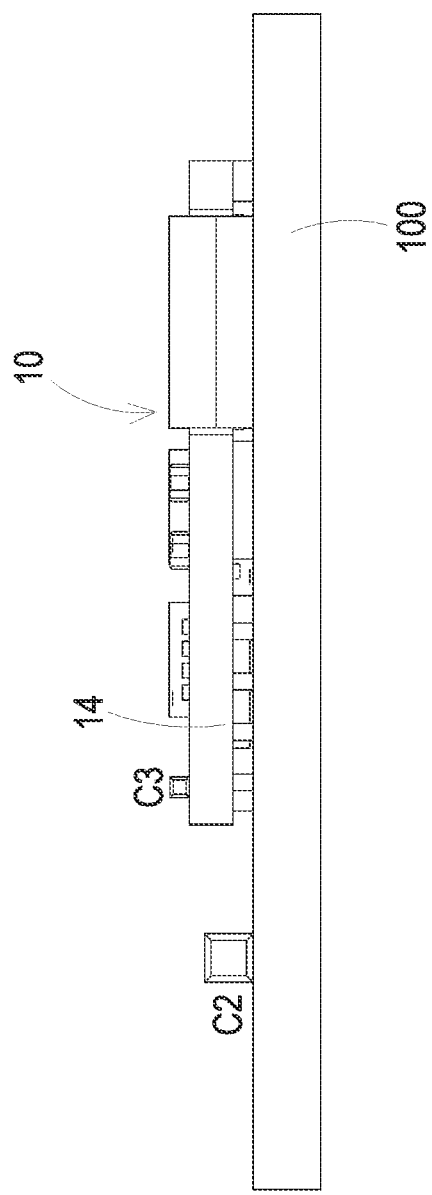
FIG. 4 is a side view of the power converter of FIG. 3.
Figure 5:
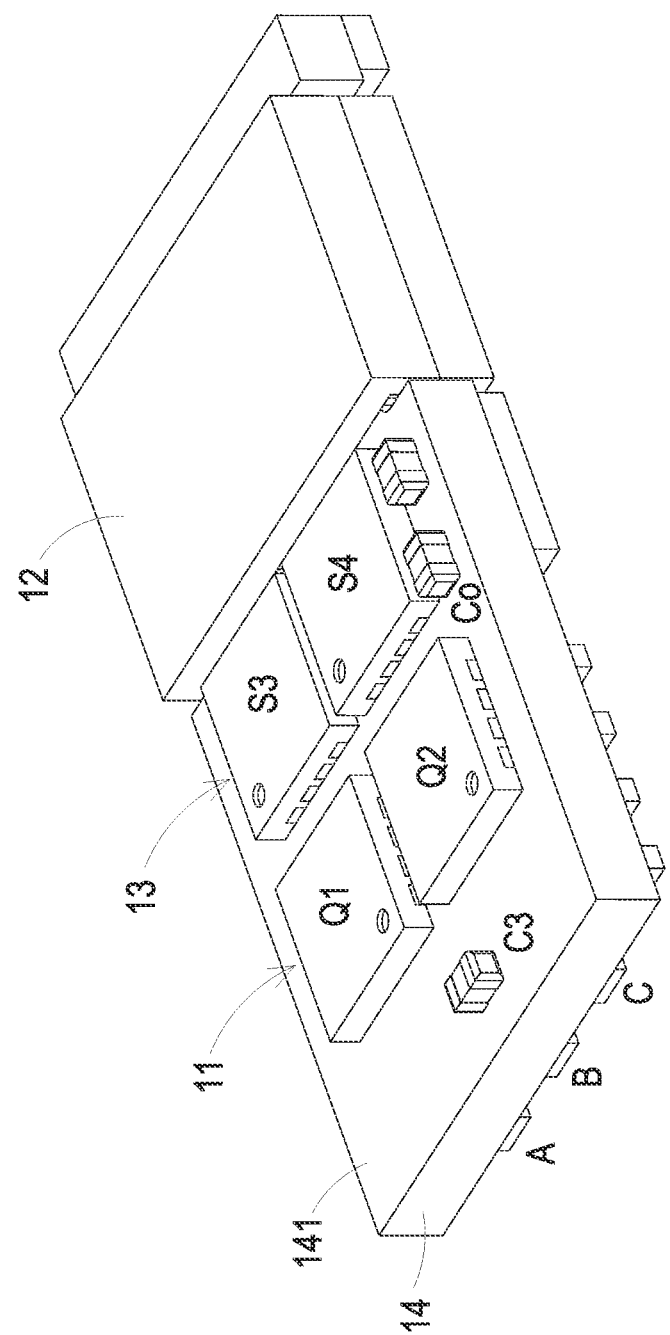
FIG. 5 and FIG. 6 are schematic perspective views illustrating the power converter of FIG. 3 from different viewpoints.
Figure 6:
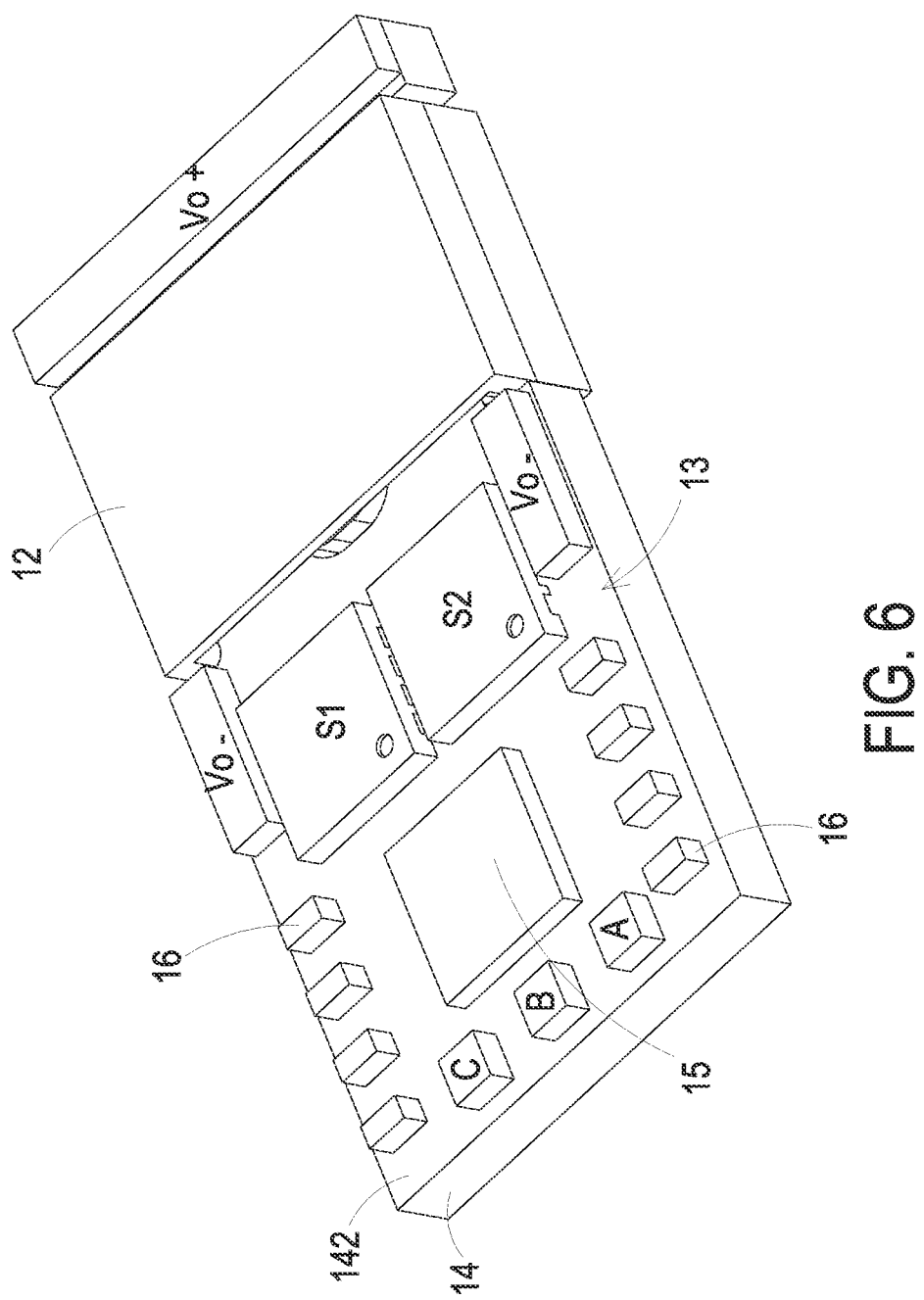

FIG. 3 is a schematic perspective view illustrating the power converter according to the first embodiment of the present disclosure. FIG. 4 is a side view of the power converter of FIG. 3. FIG. 5 and FIG. 6 are schematic perspective views illustrating the power converter of FIG. 3 from different viewpoints. As shown in FIG. 3, FIG. 5, and FIG. 6, the power module 10 further includes a circuit board 14. The absorption capacitor C3, the primary switch circuit 11, the magnetic component 12, and the secondary circuit 13 of the power module 10 are all disposed on the circuit board 14. The power converter 1 further includes a substrate 100, and the first capacitor C1, the second capacitor C2, and the power module 10 are all disposed on the substrate 100. The first capacitor C1 and the second capacitor C2 are electrically connected to the power module 10 through the substrate 100 (the electrical connection path via the substrate 100 is represented by a dotted line in FIG. 1). Since the capacitances of the first capacitor C1 and the second capacitor C2 are both larger than the capacitance of the absorption capacitor C3, the volumes of the first capacitor C1 and the second capacitor C2 are both larger than the volume of the absorption capacitor C3. Considering the cost and the area occupied by the capacitors, the package with large volume is generally adopted. If the first capacitor C1 and the second capacitor C2 are disposed on the circuit board 14, the overall height of the power converter 1 would be greatly increased. Therefore, in the present disclosure, the first capacitor C1 and the second capacitor C2 are disposed separately from the power module 10, thereby decreasing the overall height of the power converter 1 (as shown in FIG. 4) and improving the power density of the power module 10. In an embodiment, the first capacitor C1 and the second capacitor C2 may be formed by a plurality of capacitors connected in parallel.

In an embodiment, as shown in FIG. 5 and FIG. 6, on the first surface 141 of the circuit board 14, the absorption capacitor C3, the first and second switches Q1 and Q2, the rectifier components S3 and S4, and the magnetic component 12 are arranged in sequence, and the output capacitor Co is disposed neighboring to the rectifier component S4 and the magnetic component 12. On the second surface 142 of the circuit board 14, the rectifier components S1 and S2 are disposed between the first, second, and third terminals A, B, and C and the magnetic component 12, the negative output terminal Vo− is disposed neighboring to the rectifier components S1 and S2 and a first side of the magnetic component 12, and the positive output terminal Vo+ is disposed neighboring to a second side of the magnetic component 12. In an embodiment, the power module 10 further includes a driving circuit 15 and a plurality of pins 16 disposed on the second surface 142 of the circuit board 14. The driving circuit 15 is disposed neighboring to the rectifier components S1 and S2. The plurality of pins 16 are disposed on two sides of the driving circuit 15 and are configured to transfer the detection signal. The arrangement positions of the components of the power module 10 on the circuit board 14 are shown as an example, but not limited thereto.

Figure 7:
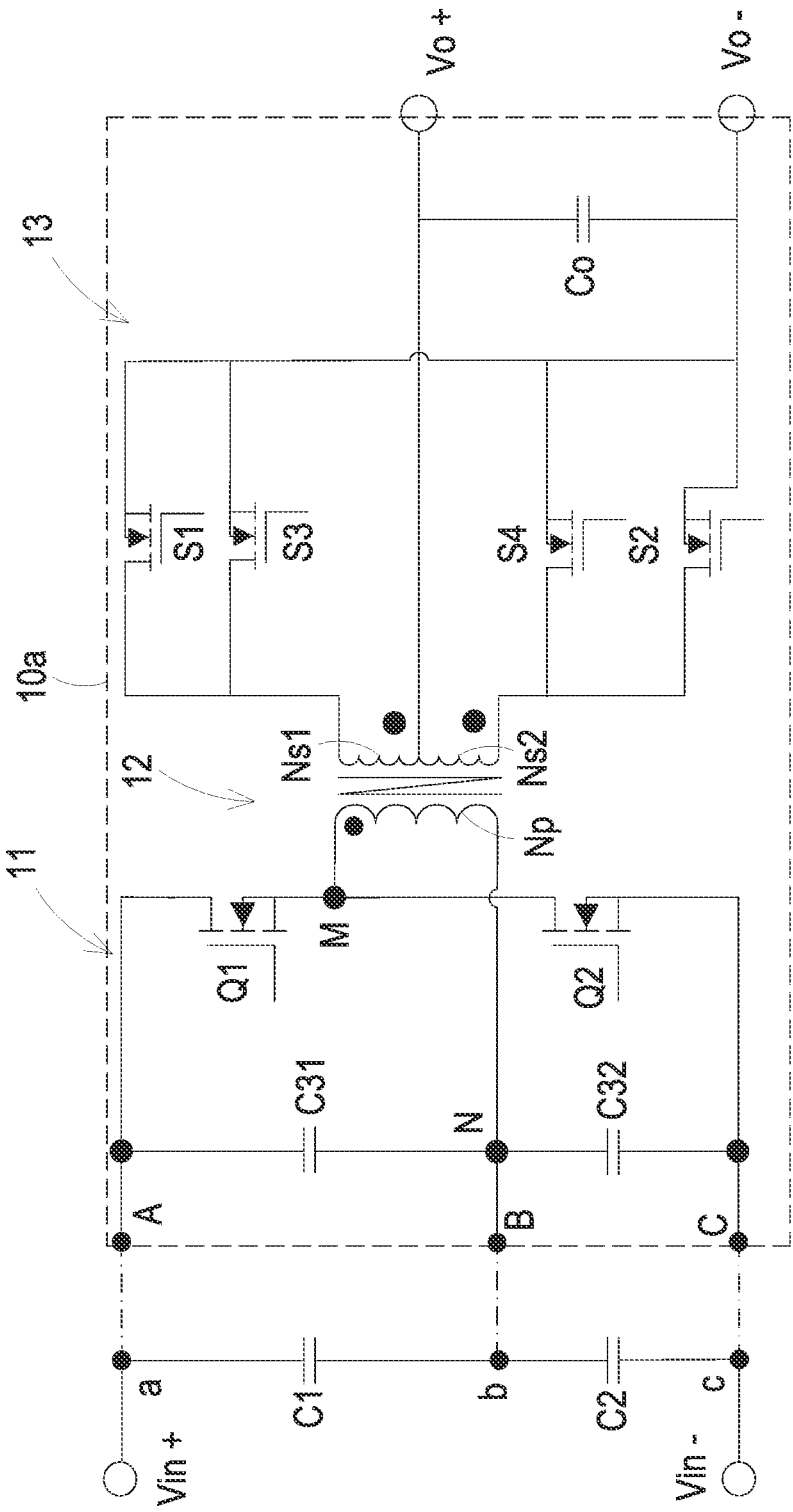
FIG. 7 is a schematic circuit diagram illustrating an alternative embodiment of the power converter of FIG. 1.
Figure 8:
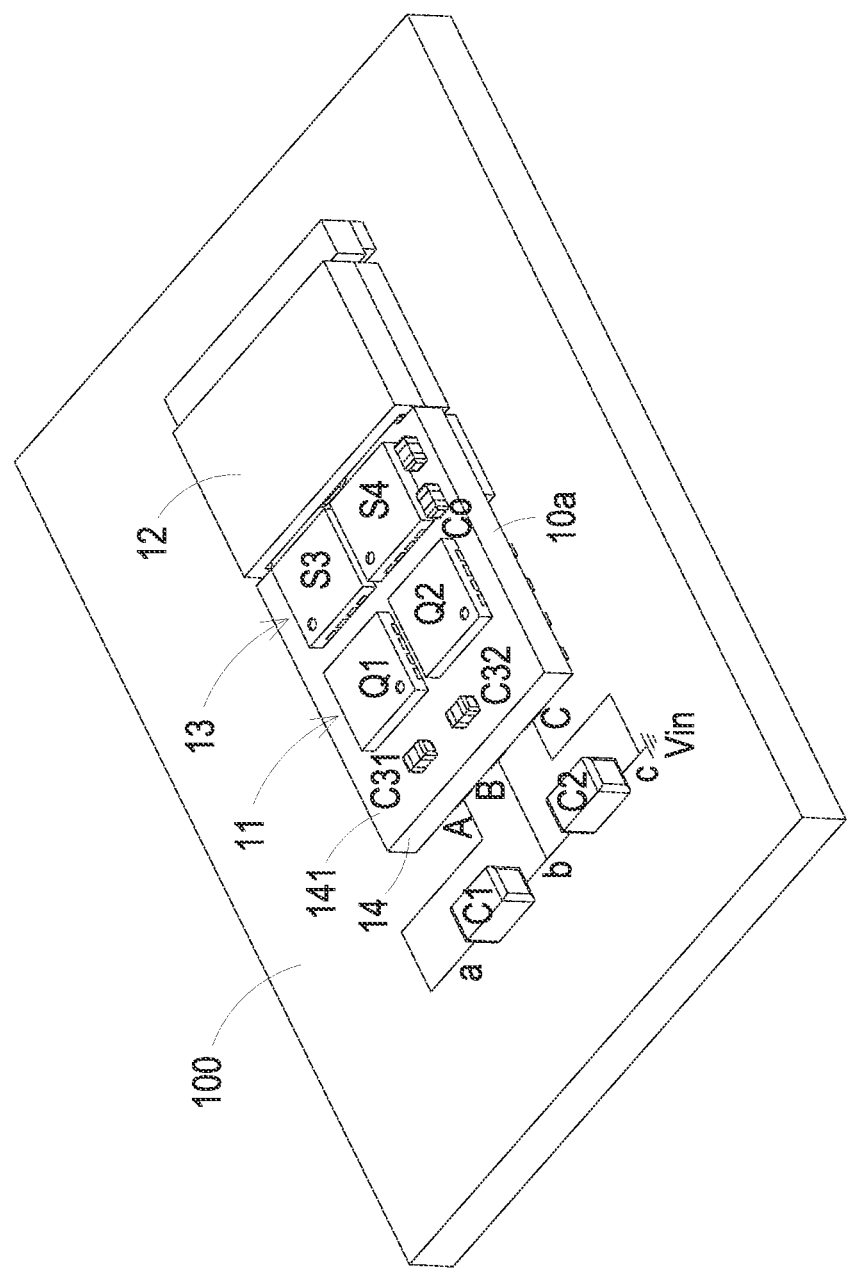
FIG. 8 is a schematic perspective view illustrating the power converter of FIG. 7.

In the above embodiments, the absorption capacitor C3 is formed by a single capacitor, but actually the number thereof is not limited thereto and is dependent on the capacitance value of the capacitor used. The absorption capacitor C3 formed by two capacitors is exemplified as follows. FIG. 7 is a schematic circuit diagram illustrating a variant of the power converter of FIG. 1. As shown in FIG. 7, in this alternative embodiment, the components corresponding to those of the power converter 1 in FIG. 1 are designated by identical numeral references, and detailed descriptions thereof are omitted herein. Compared with the power converter 1 of FIG. 1, the absorption capacitor of the power module 10a of the power converter 1a in FIG. 7 includes a first absorption capacitor C31 and a second absorption capacitor C32 connected in series. There is a second capacitor midpoint N between the first absorption capacitor C31 and the second absorption capacitor C32, and the second capacitor midpoint N is electrically connected to the second terminal B of the power module 10a. The perspective view of the power converter 1a in this alternative embodiment is shown in FIG. 8.

Figure 9:
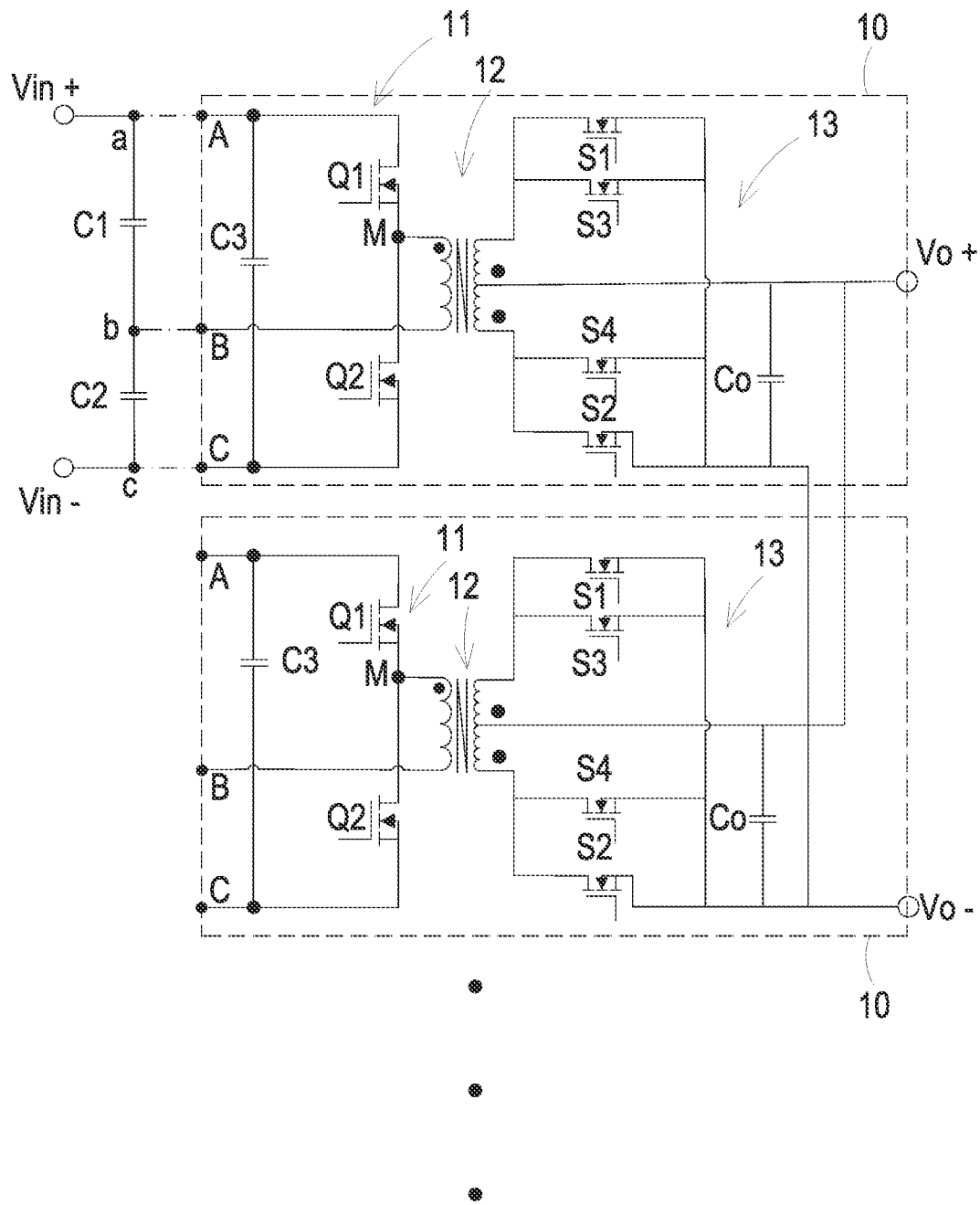
FIG. 9 and FIG. 10 are respectively a schematic circuit diagram and a schematic perspective view illustrating an alternative embodiment of the power converter of FIG. 1.
Figure 10:
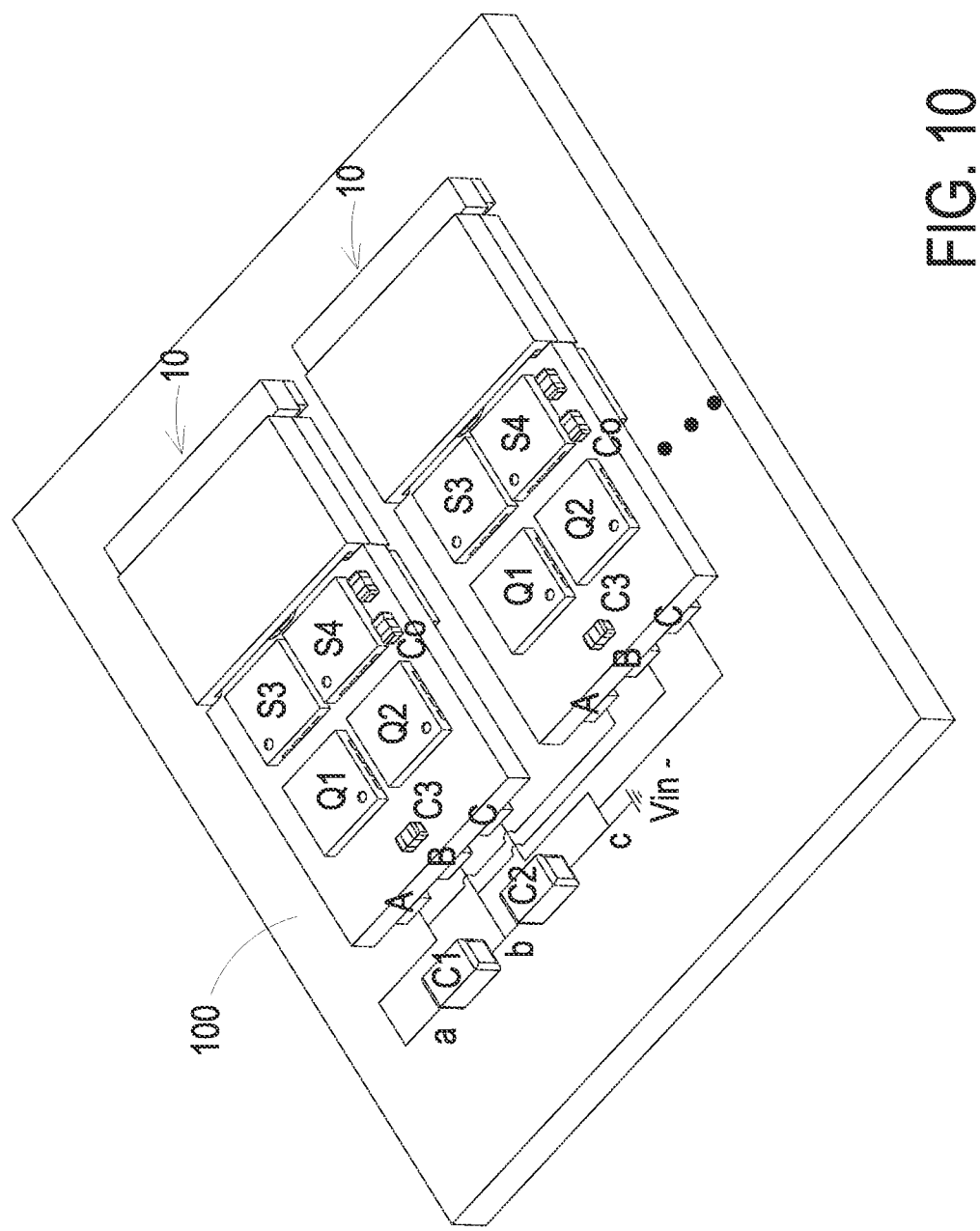

In addition, in the above embodiments, the power converter includes only one power module, but actually the number of power module is not limited thereto. For example, in an embodiment, as shown in FIG. 9, the power converter 1 in the first embodiment may include a plurality of power modules 10. The first terminals A of the plurality of power modules 10 are electrically connected to each other, the second terminals B of the plurality of power modules 10 are electrically connected to each other, and the third terminals C of the plurality of power modules 10 are electrically connected to each other. The perspective view illustrating the power converter 1 which includes a plurality of power modules 10 is shown in FIG. 10. The corresponding first, second, or third terminals A, B, or C are electrically connected to each other through the substrate 100. For making FIG. 9 concise, the actual connection line between the terminals is not shown in FIG. 9.

Figure 11:
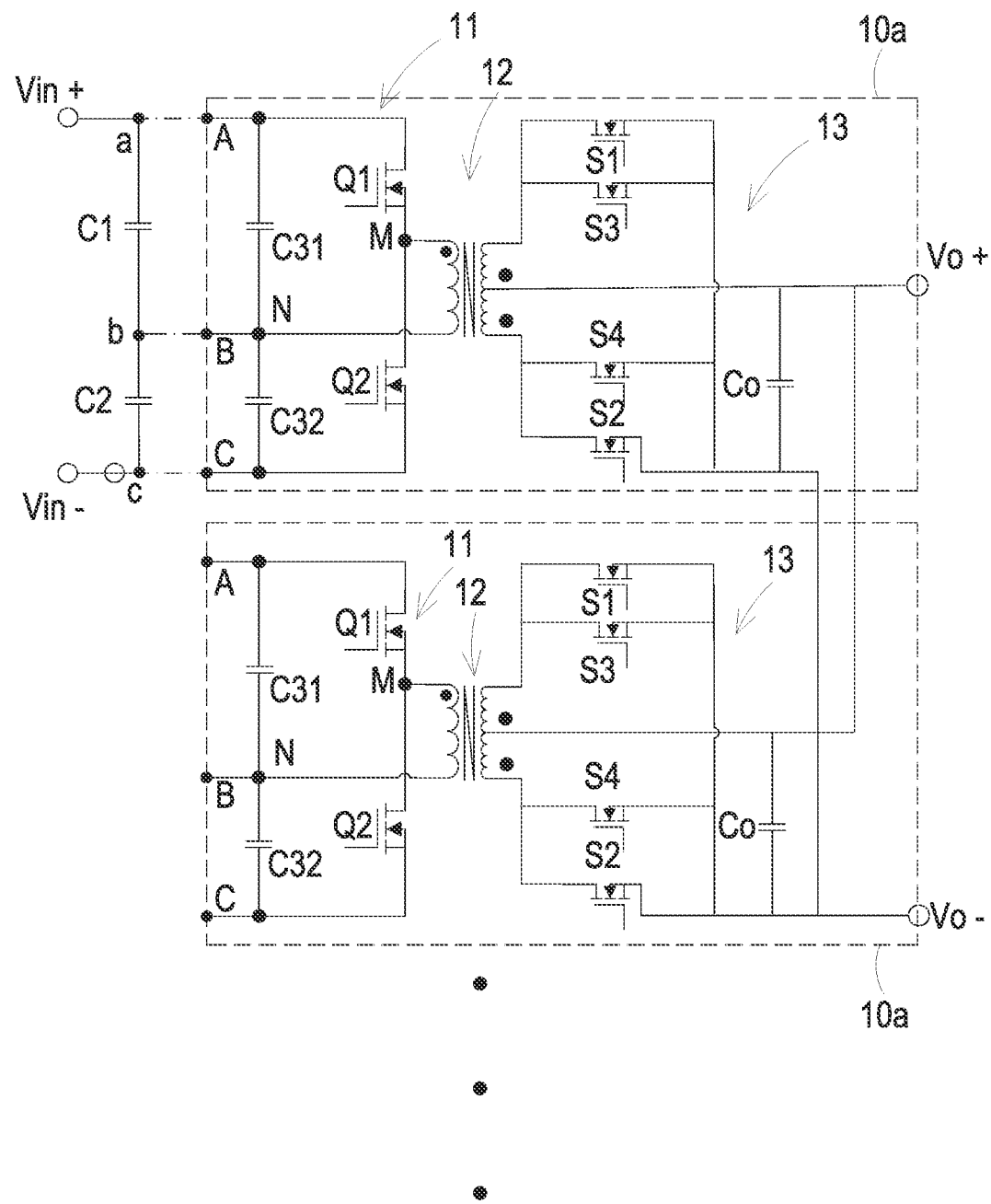
FIG. 11 and FIG. 12 are respectively a schematic circuit diagram and a schematic perspective view illustrating an alternative embodiment of the power converter of FIG. 7.
Figure 12:
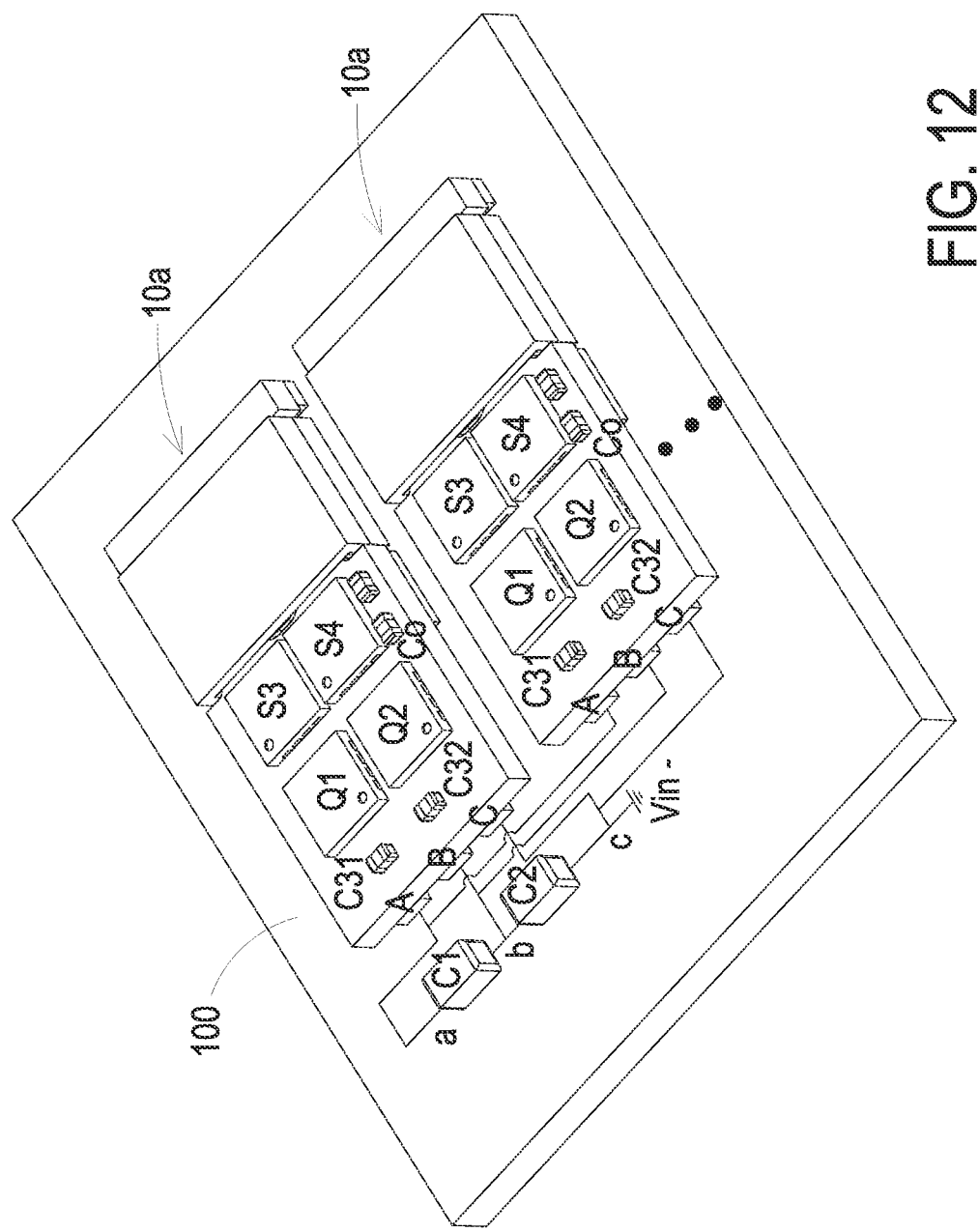

Of course, as shown in FIG. 11, the power converter 1a may also include a plurality of power modules 10a. Similarly, the first terminals A of the plurality of power modules 10a are electrically connected to each other, the second terminals B of the plurality of power modules 10a are electrically connected to each other, and the third terminals C of the plurality of power modules 10a are electrically connected to each other. The perspective view illustrating the power converter 1a which includes a plurality of power modules 10a is shown in FIG. 12. The corresponding first, second, or third terminals A, B, or C are electrically connected to each other through the substrate 100. For making FIG. 11 concise, the actual connection line between the terminals is not shown in FIG. 11.

Figure 13:
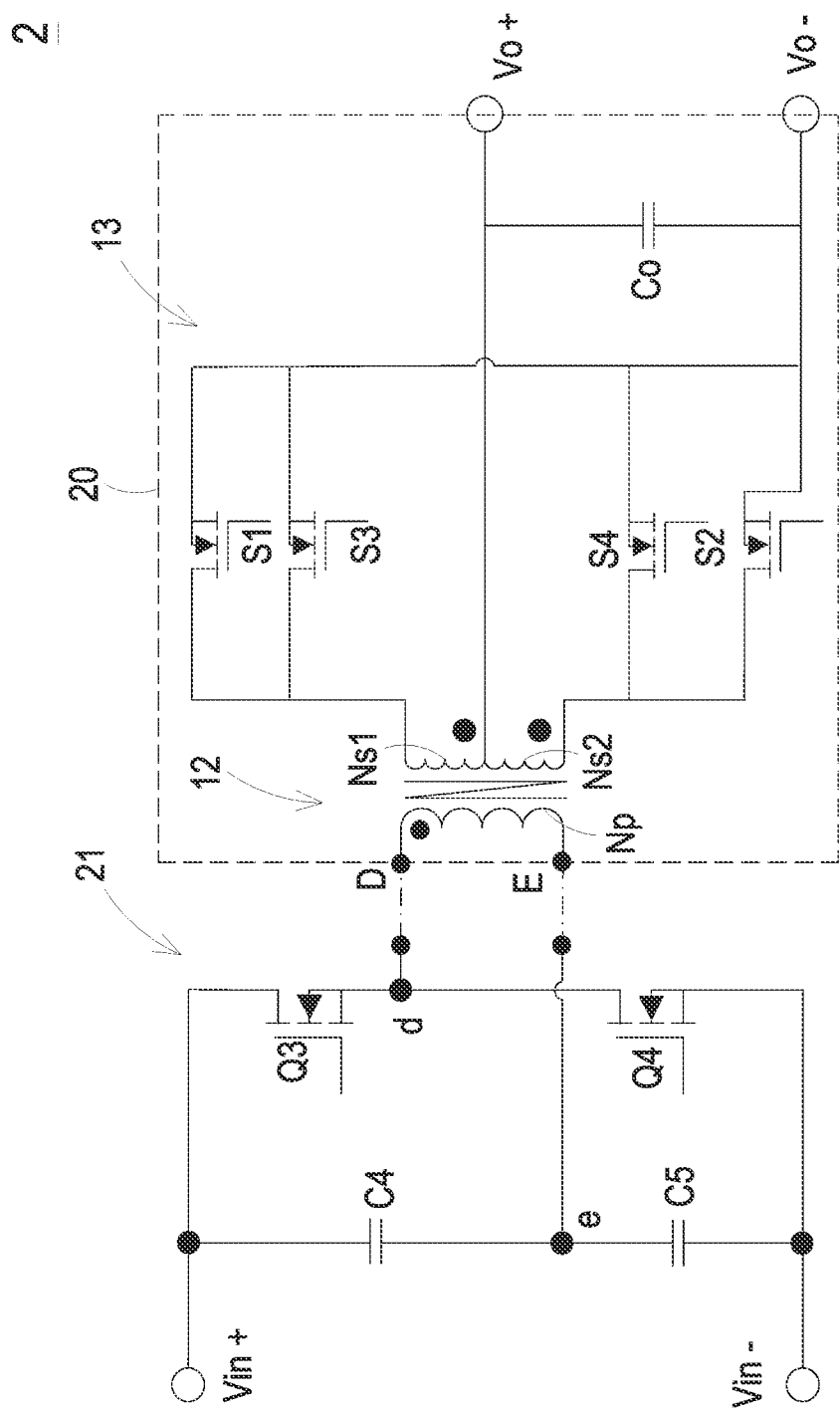
FIG. 13 is a schematic circuit diagram illustrating a power converter according to a second embodiment of the present disclosure.

FIG. 13 is a schematic circuit diagram illustrating a power converter according to a second embodiment of the present disclosure. As shown in FIG. 13, the power converter 2 receives an input voltage Vin through a positive input terminal Vin+ and a negative input terminal Vin−, and outputs an output voltage Vo through a positive output terminal Vo+ and a negative output terminal Vo−. The power converter 2 includes a first capacitor C4, a second capacitor C5, a primary switch circuit 21, and a power module 20. The first capacitor C4 and the second capacitor C5 are connected in series. A first terminal of the first capacitor C4 and a first terminal of the second capacitor C5 are electrically connected to a capacitor midpoint e, a second terminal of the first capacitor C4 is electrically connected to the positive input terminal Vin+, and a second terminal of the second capacitor C2 is electrically connected to the negative input terminal Vin−. The primary switch circuit 21 includes a first switch Q3 and a second switch Q4 connected in series between the positive input terminal Vin+ and the negative input terminal Vin−. There is a switch midpoint d between the first switch Q3 and the second switch Q4. The first capacitor C4 and the second capacitor C5 are configured to divide the input voltage Vin and to absorb the voltage stress while turning on or off the first switch Q3 and the second switch Q4.

The power module 20 is electrically connected to the first capacitor C4, the second capacitor C5, and the primary switch circuit 21.

The power module 20 includes the magnetic component 12 and the secondary circuit 13 and has a first terminal D and a second terminal E. The detailed structures of the magnetic component 12 and the secondary circuit 13 are the same as those shown in FIG. 1, thus the detailed descriptions thereof are omitted herein. In this embodiment, the first terminal D of the power module 20 is electrically connected to the switch midpoint d and the first terminal of the primary winding Np of the magnetic component 12. The second terminal E of the power module 20 is electrically connected to the capacitor midpoint e and the second terminal of the primary winding Np of the magnetic component 12.

Figure 14:
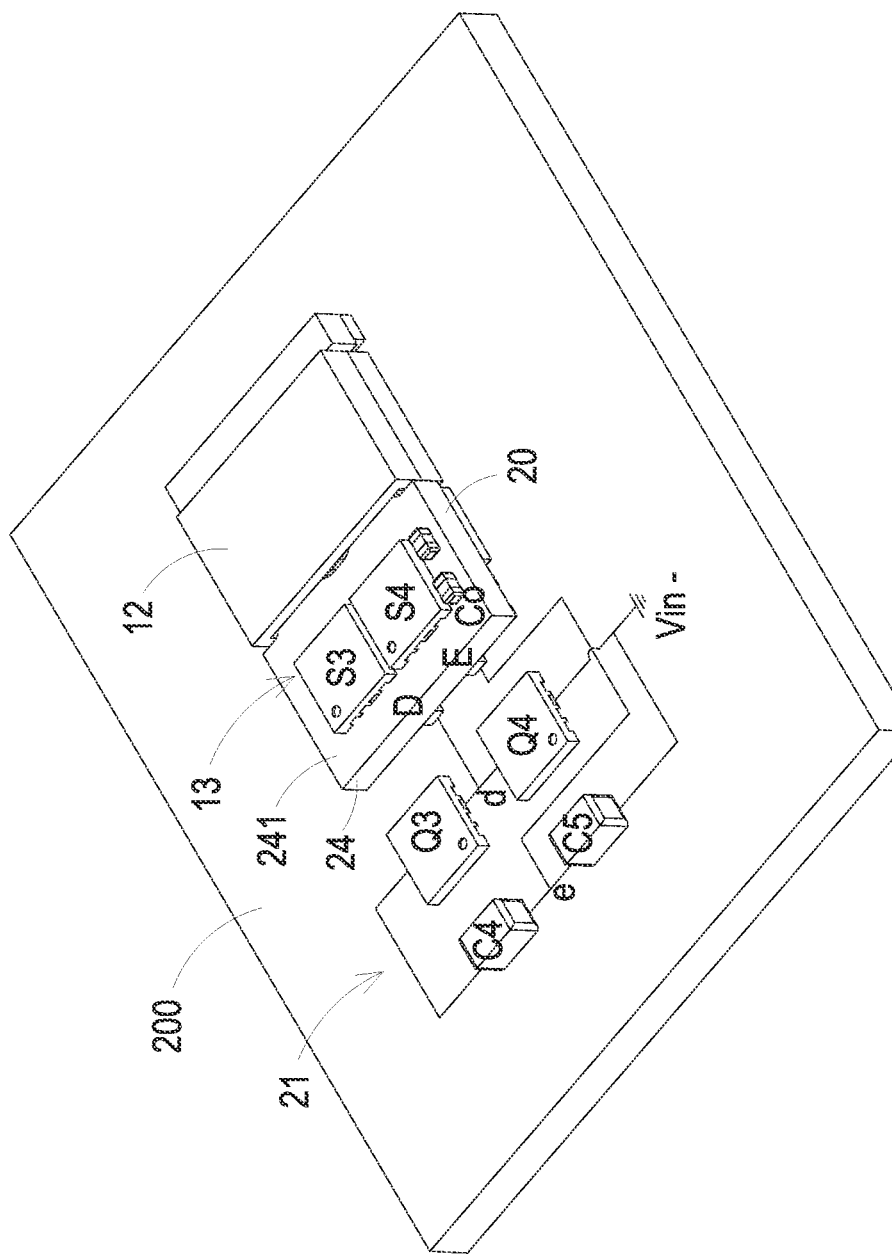
FIG. 14 is a schematic perspective view illustrating the power converter according to the second embodiment of the present disclosure.
Figure 15:
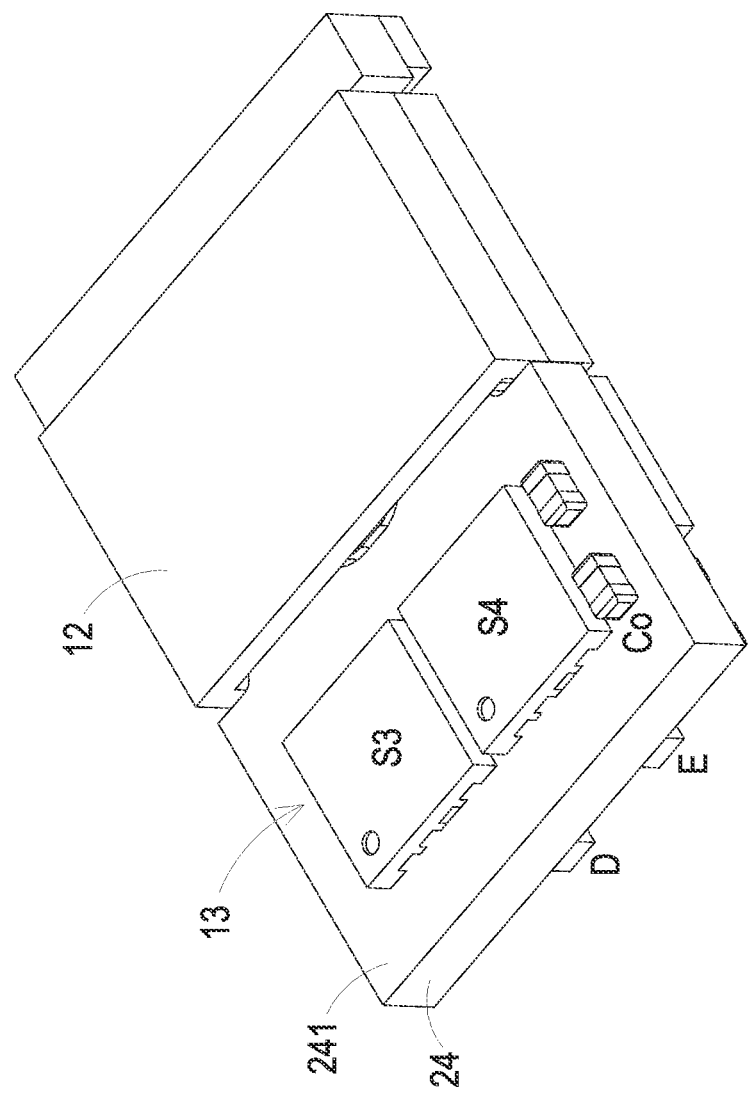
FIG. 15 and FIG. 16 are schematic perspective views illustrating the power converter of FIG. 14 from different viewpoints.
Figure 16:
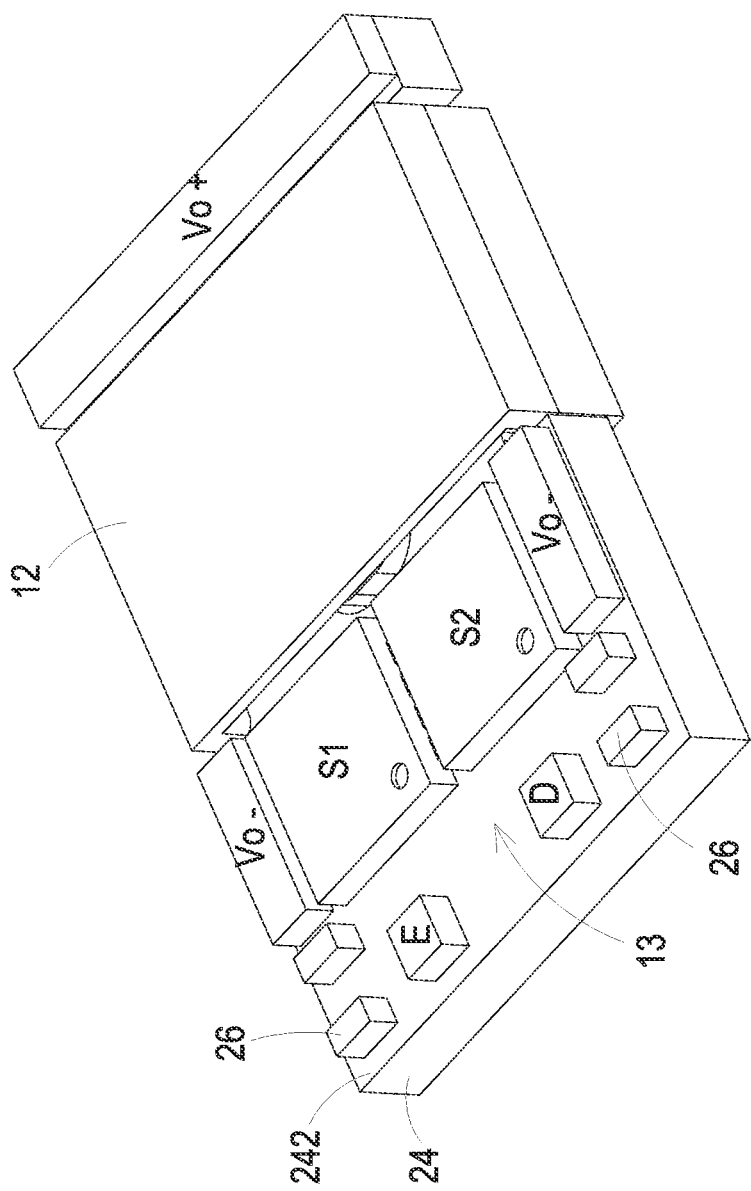

FIG. 14 is a schematic perspective view illustrating the power converter according to the second embodiment of the present disclosure. FIG. 15 and FIG. 16 are schematic perspective views illustrating the power converter of FIG. 14 from different viewpoints. As shown in FIG. 14, FIG. 15, and FIG. 16, the power module 20 further includes a circuit board 24, and the magnetic component 12 and the secondary circuit 13 of the power module 20 are both disposed on the circuit board 24. The power converter 2 further includes a substrate 200, and the first capacitor C4, the second capacitor C5, the primary switch circuit 21, and the power module 20 are all disposed on the substrate 200. The first capacitor C4, the second capacitor C5, and the primary switch circuit 21 are electrically connected to the power module 20 through the substrate 200 (the electrical connection path via the substrate 200 is represented by a dotted line in FIG. 13). Through disposing the first capacitor C4 and the second capacitor C5 separately from the power module 20, the overall height of the power converter 2 is decreased, and the power density of the power module 20 is improved.

In an embodiment, as shown in FIG. 15 and FIG. 16, on the first surface 241 of the circuit board 24, the rectifier components S3 and S4 are disposed neighboring to the magnetic component 12, and the output capacitor Co is disposed neighboring to the rectifier component S4 and the magnetic component 12. On the second surface 242 of the circuit board 24, the rectifier components S1 and S2 are disposed between the first and second terminals A and B and the magnetic component 12, the negative output terminal Vo− is disposed neighboring to the rectifier components S1 and S2 and a first side of the magnetic component 12, and the positive output terminal Vo+ is disposed neighboring to a second side of the magnetic component 12. In an embodiment, the power module 20 further includes a plurality of pins 26 disposed on the second surface 242 of the circuit board 24. The plurality of pins 26 are disposed on two sides of the first and second terminals D and E and are configured to transfer the detection signal. The arrangement positions of the components of the power module 20 on the circuit board 24 are shown as an example, but not limited thereto.

Figure 17:
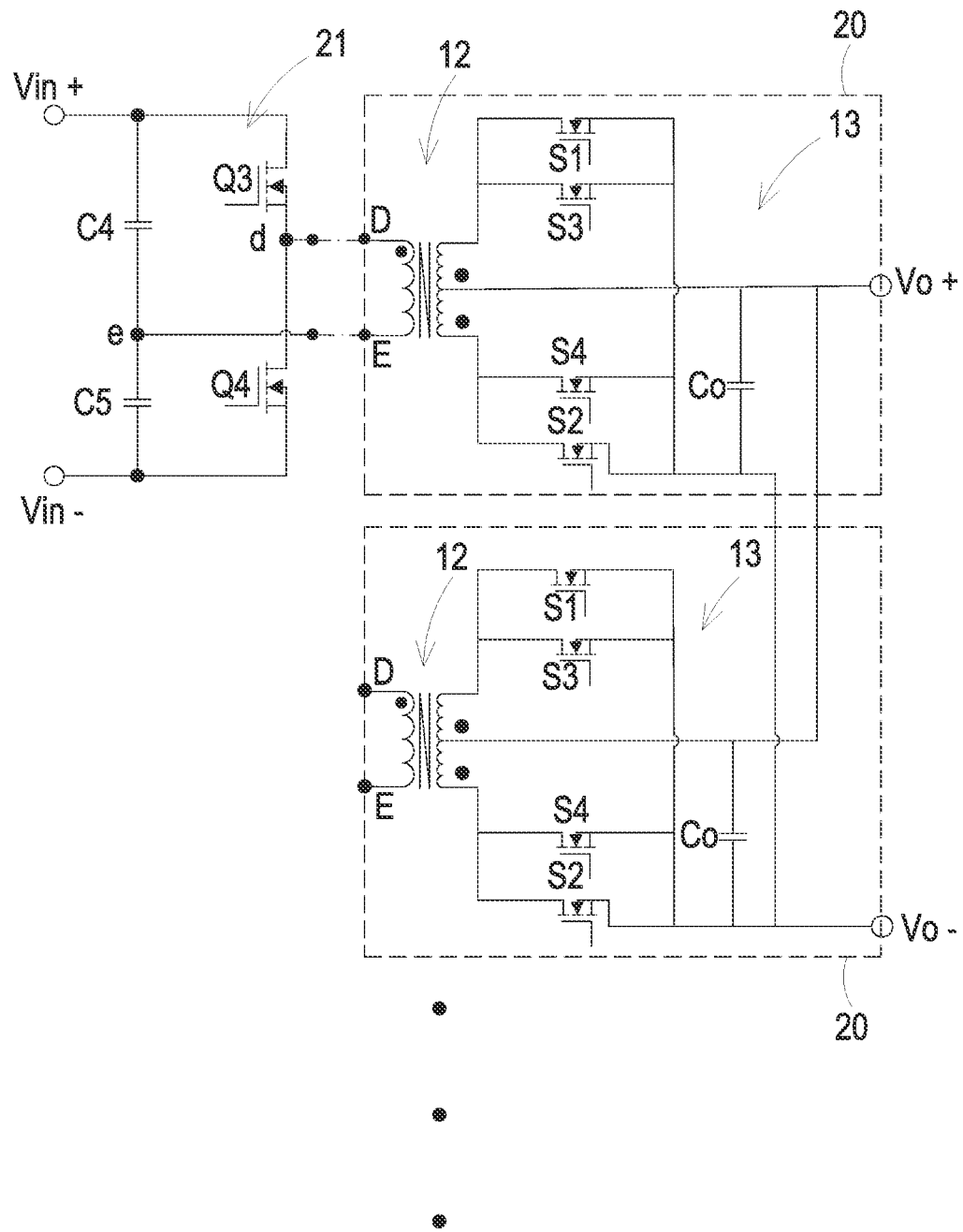
FIG. 17 and FIG. 18 are respectively a schematic circuit diagram and a schematic perspective view illustrating an alternative embodiment of the power converter of FIG. 13.
Figure 18:
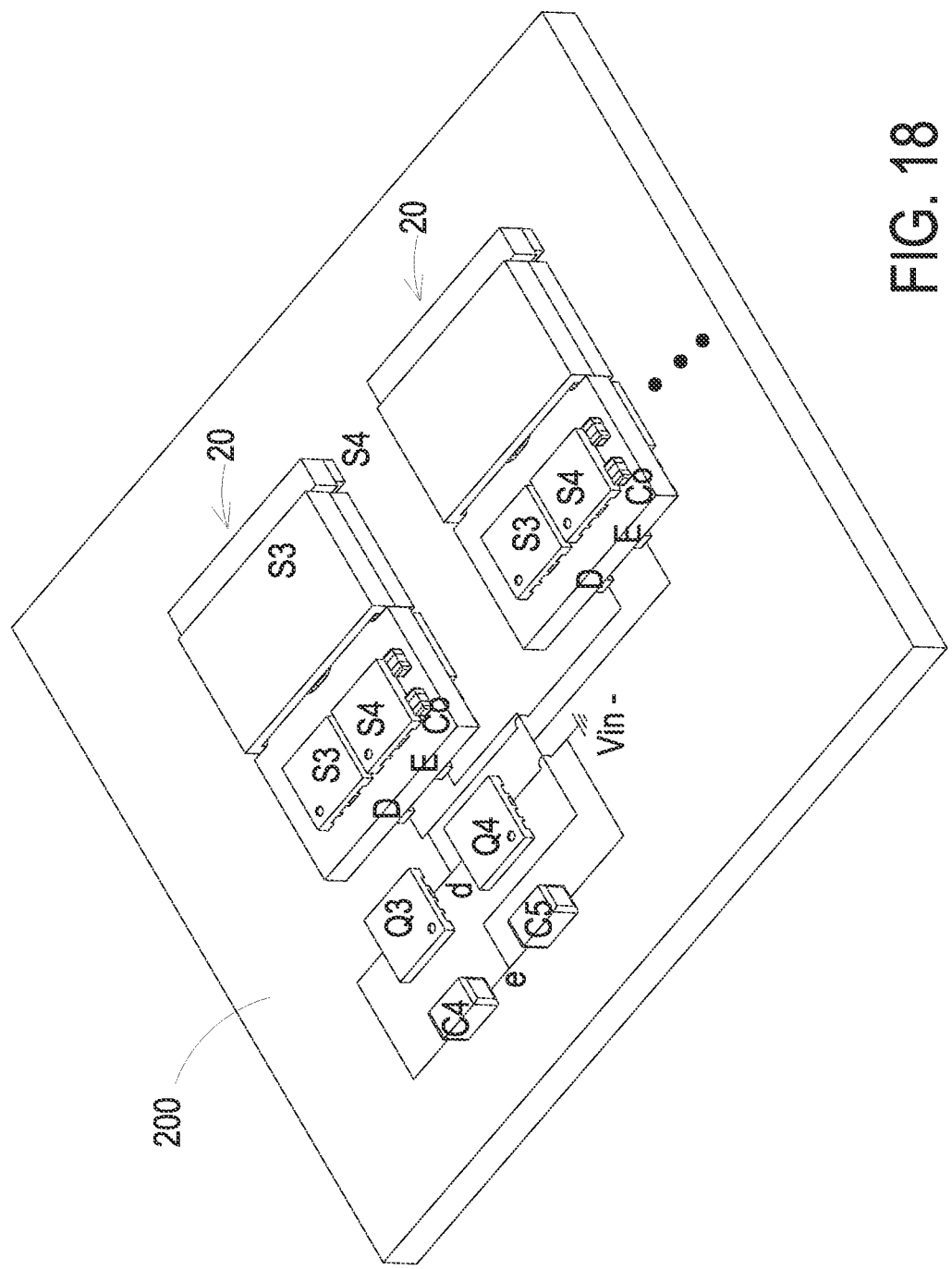

In addition, in the embodiments shown in FIGS. 13 to 16, the power converter 2 includes only one power module 20, but actually the number of power module 20 is not limited thereto. For example, in an embodiment, as shown in FIG. 17, the power converter 2 may include a plurality of power modules 20. The first terminals D of the plurality of power modules 20 are electrically connected to each other, and the second terminals E of the plurality of power modules 20 are electrically connected to each other. The perspective view illustrating the power converter 2 which includes a plurality of power modules 20 is shown in FIG. 18. The corresponding first or second terminals D or E are electrically connected to each other through the substrate 200. For making FIG. 17 concise, the actual connection line between the terminals is not shown in FIG. 17.

In another embodiment, the power converter shown in FIG. 14 and FIG. 18 further includes an additional circuit board (not shown) disposed on the substrate 200 together with the power module 20, and the first capacitor C4, the second capacitor C5, and the primary switch circuit 21 are disposed on the additional circuit board. The first capacitor C4, the second capacitor C5, and the primary switch circuit 21 are electrically connected to the power module 20 through the additional circuit board and the substrate 200. Consequently, the overall height of the power converter is decreased, and the power density of the power module is improved.

Figure 19:
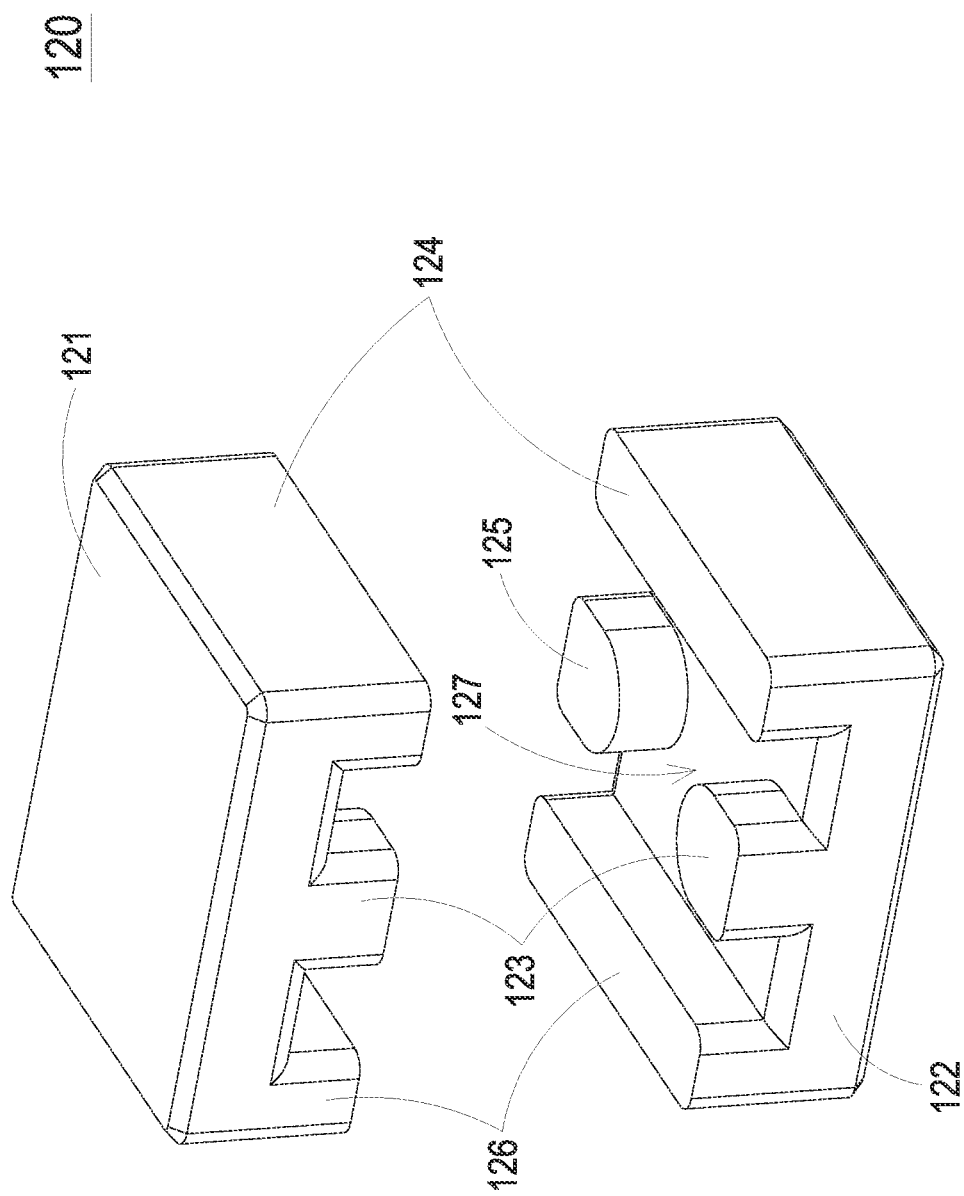
FIG. 19 is a schematic exploded view illustrating a magnetic core assembly of a magnetic component according to an embodiment of the present disclosure, and FIG. 20 schematically showing the magnetic component of FIG. 19 with the first magnetic cover being removed.
Figure 20:
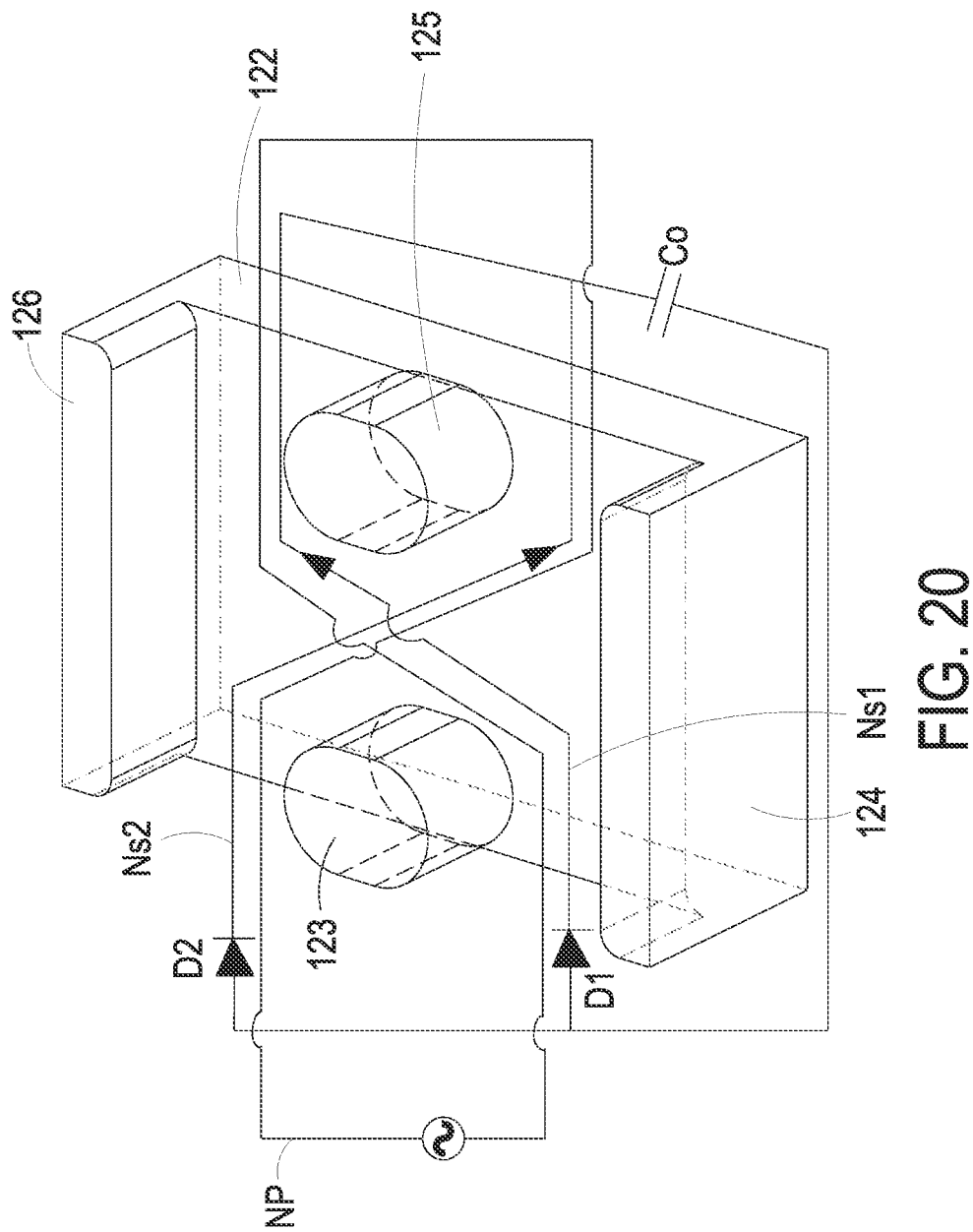

FIG. 19 is a schematic exploded view illustrating a magnetic core assembly of a magnetic component according to an embodiment of the present disclosure, and FIG. 20 schematically showing the magnetic component of FIG. 19 with the first magnetic cover being removed. As shown in FIG. 19 and FIG. 20, the magnetic component 12 includes a magnetic core assembly 120, the primary winding Np, the first secondary winding Ns1, and the second secondary winding Ns2. The magnetic core assembly 120 includes a first magnetic cover 121, a second magnetic cover 122, a first magnetic pillar 123, a second magnetic pillar 124, a third magnetic pillar 125, and a fourth magnetic pillar 126. The first magnetic pillar 123 and the third magnetic pillar 125 are disposed between the first magnetic cover 121 and the second magnetic cover 122 and are opposite to each other. The second magnetic pillar 124 and the fourth magnetic pillar 126 are disposed between the first magnetic cover 121 and the second magnetic cover 122 and are opposite to each other. The first magnetic pillar 123 and the third magnetic pillar 125 are located between the second magnetic pillar 124 and the fourth magnetic pillar 126. The reluctances of the second magnetic pillar 124 and the fourth magnetic pillar 126 are larger than the reluctances of the first magnetic pillar 123 and the third magnetic pillar 125 respectively. A connection region 127 is defined by the first magnetic pillar 123, the second magnetic pillar 124, the third magnetic pillar 125, and the fourth magnetic pillar 126 collaboratively therebetween. The first magnetic cover 121 is not shown in the magnetic component 12 in FIG. 20 so that the number of the magnetic pillars, the positions of the magnetic pillars, and the winding manner for the windings can be clearly displayed.

In addition, the primary winding Np is wound around the first magnetic pillar 123 and the third magnetic pillar 125 through the connection region 127, and directions of the magnetic fluxes on the first magnetic pillar 123 and the third magnetic pillar 125 are opposite. The first terminal of the first secondary winding Ns1 passes through the space between the first magnetic pillar 123 and the second magnetic pillar 124. The second terminal of the first secondary winding Ns1 passes through the space between the third magnetic pillar 125 and the fourth magnetic pillar 126. The first terminal of the second secondary winding Ns2 passes through the space between the first magnetic pillar 123 and the fourth magnetic pillar 126. The second terminal of the second secondary winding Ns2 passes through the space between the second magnetic pillar 124 and the third magnetic pillars 125.

In this embodiment, the reluctances of the second magnetic pillar 124 and the fourth magnetic pillar 126 are larger than the reluctances of the first magnetic pillar 123 and the third magnetic pillar 125 respectively, and the windings are arranged with intersection. Accordingly, the magnetic component 12 has the advantages of the small ripple of the AC current flowing through the primary winding Np, the first secondary winding Ns1, and the second secondary winding Ns2 and the strong capability of avoiding current saturation of the magnetic core.

In an embodiment, the second magnetic pillar 124 and the fourth magnetic pillar 126 include an air gap, and the first magnetic pillar 123 and the third magnetic pillar 125 may not include an air gap, but not limited thereto. In another embodiment, the first magnetic pillar 123 and the third magnetic pillar 125 may include an air gap, the length of the air gap on the second magnetic pillar 124 is greater than the length of the air gap on the first magnetic pillar 123, and the length of the air gap on the fourth magnetic pillar 126 is greater than the length of the air gap on the third magnetic pillar 125. In addition, the air gap of each magnetic pillar may be located at the top of the corresponding magnetic pillar and adjacent to the first magnetic cover 121, the air gap of each magnetic pillar may be located at the bottom of the corresponding magnetic pillar and adjacent to the second magnetic cover 122, or the air gap of each magnetic pillar may be located at the middle of the corresponding magnetic pillar.

In some embodiments, the primary winding Np is crossly wound around the first magnetic pillar 123 and the third magnetic pillar 125 through the connection region 127 with a "∞" shape, so as to make the directions of the magnetic fluxes on the first magnetic pillar 123 and the third magnetic pillar 125 opposite to each other. In detail, the primary winding Np passes through the space between the first magnetic pillar 123 and the fourth magnetic pillar 126, the connection region 127, and the space between the second magnetic pillar 124 and the third magnetic pillar 125 in sequence, and then surrounds the third magnetic pillar 125.

Afterwards, the primary winding Np passes through the space between the third magnetic pillar 125 and the fourth magnetic pillar 126, the connection region 127, and the space between the first magnetic pillar 123 and the second magnetic pillar 124, and then surrounds the first magnetic pillar 123. Therefore, the first terminal of the primary winding Np passes through the space between the first magnetic pillar 123 and the fourth magnetic pillar 126, the second terminal of the primary winding Np passes through the space between the first magnetic pillar 123 and the second magnetic pillar 124, and the first and second terminals of the primary winding Np are located at the same side of the magnetic core assembly 120. Of course, in another embodiment, a part of the primary winding Np may be wound around the first magnetic pillar 123 firstly, and then the other part of the primary winding Np passes through the connection region 127 to be wound around the third magnetic pillar 125.

Furthermore, as shown in FIG. 1 and FIG. 7, the first rectifier component limits the current direction on the first secondary winding Ns1, and the second rectifier component limits the current direction on the second secondary winding Ns2. Accordingly, the current directions of the currents flowing through the first secondary winding Ns1 and the second secondary winding Ns2 respectively are the same, which flows from the first terminal to the second terminal of the corresponding secondary winding. In FIG. 20, diodes D1 and D2 represent the first rectifier component and the second rectifier component respectively. The directions of the arrows depicted on the first and second secondary windings Ns1 and Ns2 represent the current directions, which both flows in and out through the first and second terminals of the corresponding secondary winding respectively.

The first voltage across the first and second terminals of the first secondary winding Ns1 and the second voltage across the first and second terminals of the second secondary winding Ns2 are out of phase with respect to each other by 180 degrees. The current flowing through the first secondary winding Ns1 and the current flowing through the second secondary winding Ns2 generate AC magnetic fluxes on the first magnetic pillar 123 and the third magnetic pillar 125 respectively. The AC magnetic fluxes on the first magnetic pillar 123 and the third magnetic pillar 125 are opposite in direction and are approximately equal in magnitude. The magnitude of the AC magnetic flux on each magnetic pillar equals the difference between the AC magnetic fluxes generated by the currents flowing through the first and second secondary windings Ns1 and Ns2 respectively on this magnetic pillar. The AC magnetic fluxes generated by the currents flowing through the first and second secondary windings Ns1 and Ns2 respectively are sum up with phases. Then, the sum of the AC magnetic fluxes is equally distributed to the second magnetic pillar 124 and the fourth magnetic pillar 126 approximately, and the directions of the AC magnetic fluxes on the second magnetic pillar 124 and the fourth magnetic pillar 126 respectively are opposite. In addition, the DC magnetic fluxes generated on the first magnetic pillar 123 by the DC currents flowing through the first and second secondary windings Ns1 and Ns2 respectively are subtracted, and the DC magnetic fluxes generated on the third magnetic pillar 125 by the DC currents flowing through the first and second secondary windings Ns1 and Ns2 respectively are subtracted. Since the primary capacitor has the function of blocking DC components, the DC components (hereinafter referred to as DC current) of the currents flowing through the first and second secondary windings Ns1 and Ns2 are approximately equal. Accordingly, the DC fluxes on the first magnetic pillar 123 and the third magnetic pillar 125 are approximately equal to zero. Moreover, the DC magnetic biases generated by the DC currents flowing through the first and secondary windings Ns1 and Ns2 respectively are connected in series in the same direction and are across the second magnetic pillar 124 and the fourth magnetic pillar 126. The air gaps on the second magnetic pillar 124 and the fourth magnetic pillar 126 are configured to prevent saturation on the second magnetic pillar 124 and the fourth magnetic pillar 126. Through the primary capacitor, the DC currents flowing through the first and second secondary windings Ns1 and Ns2 are approximately equal. In an embodiment, the primary capacitor includes a first capacitor and a second capacitor. In an embodiment, in addition to the first current sharing approach based on the primary capacitor described above, the second current sharing approach based on adding blocking capacitor (not shown) may be utilized to make the DC currents flowing through the first and second secondary windings Ns1 and Ns2 approximately equal. In the second current sharing approach, the blocking capacitor is electrically connected to the primary winding Np in series. Further, the third current sharing approach based on adding current sharing circuit (not shown) may be utilized to make the DC currents flowing through the first and second secondary windings Ns1 and Ns2 approximately equal. At least one of the three current sharing approaches can be selected to apply in the power converter.

In addition, in this embodiment, the first magnetic pillar 123 has large AC magnetic flux, small air gap, and small reluctance. Compared with the first magnetic pillar 123, the second magnetic pillar 124 has smaller AC magnetic flux, larger air gap, and larger reluctance, which causes the first secondary winding Ns1 to have small AC current ripple and large equivalent inductance. The third magnetic pillar 125 has large AC magnetic flux, small air gap, and small reluctance. Compared with the third magnetic pillar 125, the fourth magnetic pillar 126 has smaller AC magnetic flux, larger air gap, and larger reluctance, which causes the second secondary winding Ns2 to have small AC current ripple and large equivalent inductance. Correspondingly, the current ripple of the primary winding Np, which is coupled to the first and second secondary windings Ns1 and Ns2, is reduced. Meanwhile, the ripple of the current flowing through the switch bridge arm of the primary switch circuit is reduced, thereby reducing the switching loss. Therefore, the magnetic component of the present disclosure has the advantages of small AC current ripple and strong capability of avoiding current saturation of the magnetic core.

In addition, regarding the composition of the magnetic core assembly 120, the material of the entire magnetic core assembly 120 may be the same, such as a ferrite material or an iron powder material. However, in another embodiment, the composing material of the first and third magnetic pillars 123 and 125 or the composing material of the second and fourth magnetic pillars 124 and 126 may be different from the composing material of the other part of the magnetic core assembly 120. For example, the composing material of the first and third magnetic pillars 123 and 125 is ferrite material, the composing material of the second and fourth magnetic pillars 124 and 126 is iron powder material with air gaps, and the composing material of the first and second magnetic covers 121 and 122 may be ferrite material or iron powder material. Consequently, the magnetic core loss of the magnetic core assembly 120 is low, and the equivalent inductances of the first and second secondary windings Ns1 and Ns2 are large. In an embodiment, the sum of the cross-sectional areas of the second and fourth magnetic pillars 124 and 126 is greater than the sum of the cross-sectional areas of the first and third magnetic pillars 123 and 125. Further, the cross-sectional area of the second magnetic pillar 124 is approximately equal to the cross-sectional area of the fourth magnetic pillar 126 with the error less than ±20%, and the cross-sectional area of the first magnetic pillar 123 is approximately equal to the cross-sectional area of the third magnetic pillar 125 with the error less than ±20%. The said error less than ±20% means that the difference between the cross-sectional areas of two magnetic pillars is less than 20% of each cross-sectional area.

Figure 21:
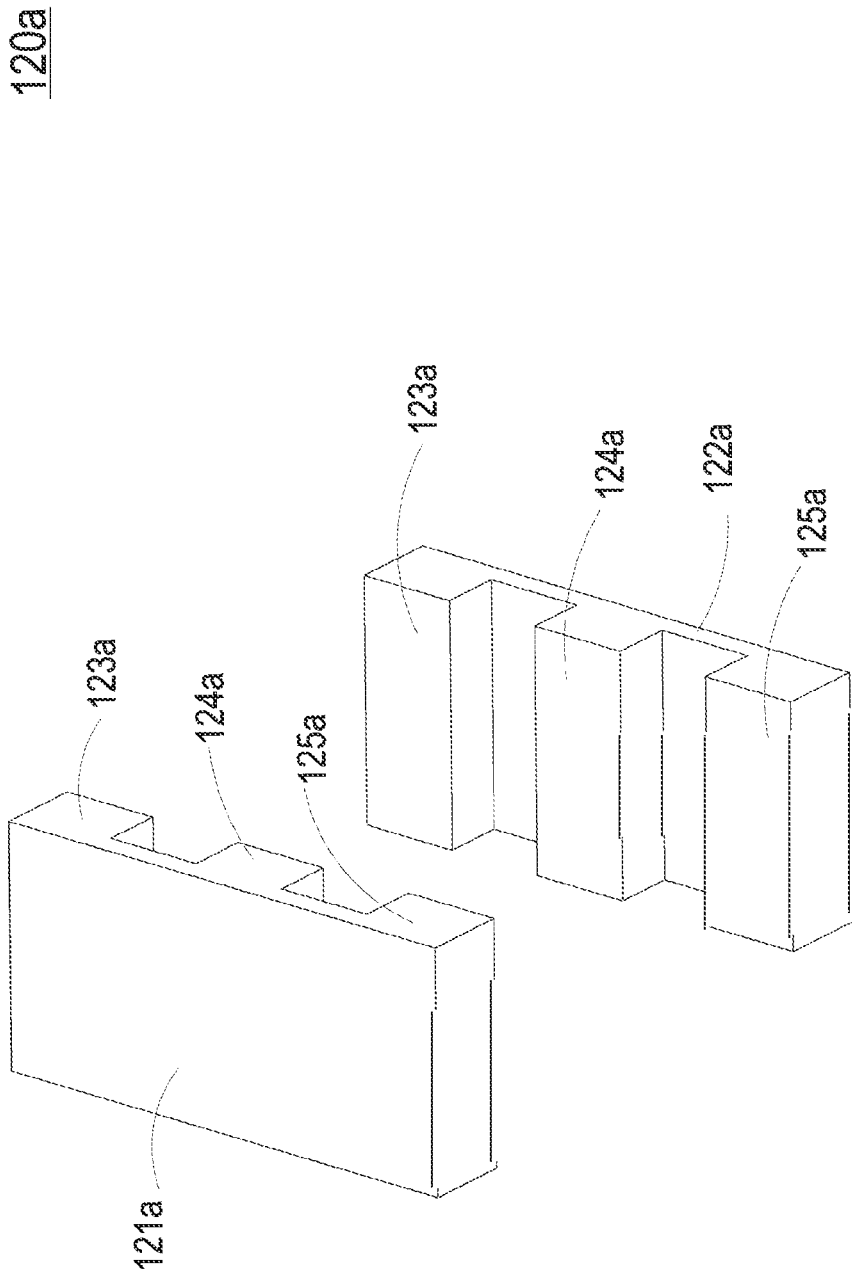
FIG. 21 is a schematic exploded view illustrating a magnetic core assembly of a magnetic component according to another embodiment of the present disclosure, and FIG. 22 schematically showing the magnetic component of FIG. 21 with the first magnetic cover being removed.
Figure 22:
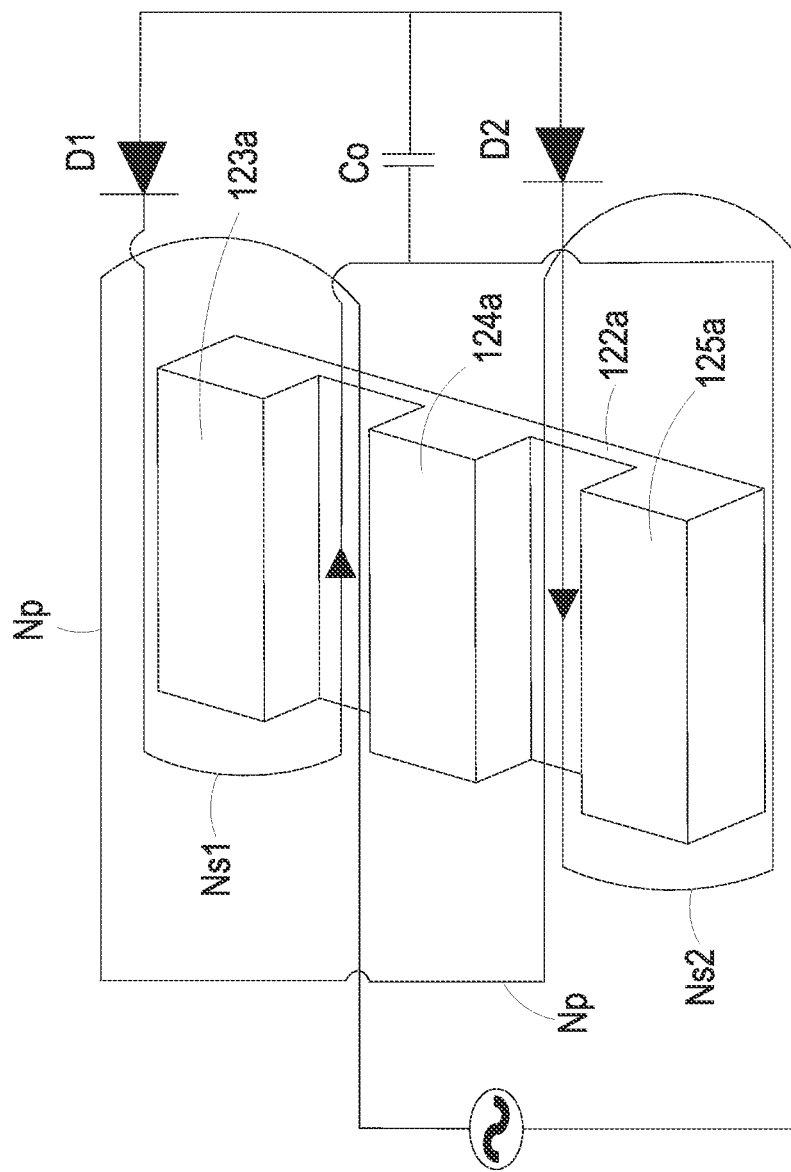

FIG. 21 is a schematic exploded view illustrating a magnetic core assembly of a magnetic component according to another embodiment of the present disclosure, and FIG. 22 schematically showing the magnetic component of FIG. 21 with the first magnetic cover being removed. As shown in FIG. 21 and FIG. 22, the magnetic component 12 includes a magnetic core assembly 120a, the primary winding Np, the first secondary winding Ns1, and the second secondary winding Ns2. The magnetic core assembly 120a includes a first magnetic cover 121a, a second magnetic cover 122a, a first magnetic pillar 123a, a second magnetic pillar 124a, and a third magnetic pillar 125a. The first magnetic pillar 123a, the second magnetic pillar 124a, and the third magnetic pillar 125a are disposed between the first magnetic cover 121a and the second magnetic cover 122a. The first magnetic pillar 123a and the third magnetic pillar 125a are opposite. The second magnetic pillar 124a is located between the first magnetic pillar 123a and the third magnetic pillar 125a. In an embodiment, the second magnetic pillar 124a includes an air gap, and the first magnetic pillar 123a and the third magnetic pillar 125a may not include an air gap, but not limited thereto. In another embodiment, the first magnetic pillar 123a and the third magnetic pillar 125a may include an air gap, and the length of the air gap on the second magnetic pillar 124a is greater than the length of the air gap on the first magnetic pillar 123a and the length of the air gap on the third magnetic pillar 125a. The first magnetic cover 121a is not shown in the magnetic core assembly 120a in FIG. 20 so that the number of the magnetic pillars, the positions of the magnetic pillars, and the winding manner for the windings can be clearly displayed. In addition, in FIG. 22, diodes D1 and D2 represent the first rectifier assembly and the second rectifier assembly respectively.

The first secondary winding Ns1 passes through the space between the first magnetic pillar 123a and the second magnetic pillar 124a, and the second secondary winding Ns2 passes through the space between the second magnetic pillar 124a and the third magnetic pillar 125a. The first rectifier component limits the current direction on the first secondary winding Ns1, and the second rectifier component limits the current direction on the second secondary winding Ns2. Accordingly, the current directions of the currents flowing through the first secondary winding Ns1 and the second secondary winding Ns2 respectively are the same, which flows from the first terminal to the second terminal of the corresponding secondary winding.

The first voltage across the first and second terminals of the first secondary winding Ns1 and the second voltage across the first and second terminals of the second secondary winding Ns2 are out of phase with respect to each other by 180 degrees. The AC magnetic flux generated by the first secondary winding Ns1 is applied to the first magnetic pillar 123a, and the AC magnetic flux generated by the second secondary winding Ns2 is applied to the third magnetic pillar 125a. The AC magnetic fluxes generated by the first secondary winding Ns1 and the second secondary winding Ns2 respectively are subtracted according to phases and then applied to the second magnetic pillar 124a. In addition, the DC magnetic fluxes generated on the second magnetic pillar 124a by the DC currents flowing through the first and second secondary windings Ns1 and Ns2 respectively are superimposed.

The primary winding Np of the magnetic component 12 is crossly wound around the first magnetic pillar 123a and the third magnetic pillar 125a through the connection regions with an "00" shape, so as to make the directions of the magnetic fluxes on the first magnetic pillar 123a and the third magnetic pillar 125a opposite to each other. In detail, the primary winding Np passes through the space between the first magnetic pillar 123a and the second magnetic pillar 124a, and winds around the first magnetic pillar 123a for at least one turn from the outside of the magnetic core assembly 120a (the first magnetic pillar 123a). Then, the primary winding Np passes through the space between the second magnetic pillar 124a and the third magnetic pillar 125a, and winds around the third magnetic pillar 125a for at least one turn from the outside of the magnetic core assembly 120a (the third magnetic pillar 125a).

In addition, regarding the composition of the magnetic core assembly 120a, the material of the entire magnetic core assembly 120a may be the same, such as a ferrite material or an iron powder material. However, in another embodiment, the composing material of the first and third magnetic pillars 123a and 125a or the composing material of the second magnetic pillar 124a may be different from the composing material of the other part of the magnetic core assembly 120a. For example, the composing material of the first and third magnetic pillars 123a and 125a is ferrite material, the composing material of the second magnetic pillar 124a is iron powder material with air gap, and the composing material of the first and second magnetic covers 121a and 122a may be ferrite material or iron powder material. Consequently, the magnetic core loss of the magnetic core assembly 120a is low, and the equivalent inductances of the first and second secondary windings Ns1 and Ns2 are large.

In the present disclosure, any of the first capacitor, the second capacitor, and the absorption capacitor may be implemented by electrically connecting a plurality of capacitors in parallel.

In summary, the present disclosure provides a power converter, which can reduce the height of the power converter and improve the power density of the power module by disposing at least part of the capacitors separately from the power module.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:
1. A power converter, comprising:
 a first capacitor and a second capacitor connected in series; and
 a power module, electrically connected to the first capacitor and the second capacitor, and comprising a circuit board, an absorption capacitor, a primary switch circuit, a magnetic component, and a secondary circuit, wherein the absorption capacitor, the primary switch circuit, the magnetic component and the secondary circuit are disposed on the circuit board, and a primary winding and a secondary winding of the magnetic component are electrically connected to the primary switch circuit and the secondary circuit respectively, wherein both of capacitances of the first capacitor and the second capacitor are larger than a capacitance of the absorption capacitor, wherein the first capacitor and the second capacitor are disposed separately from the power module.

2. The power converter according to claim 1, further comprising a substrate, wherein the first capacitor, the second capacitor and the power module are disposed on the substrate, and the power module is electrically connected to the first capacitor and the second capacitor through the substrate.

3. The power converter according to claim 1, wherein the primary switch circuit comprises two switches connected in series, there is a switch midpoint between the two switches, and the primary switch circuit, the absorption capacitor, the first capacitor, and the second capacitor form a half-bridge circuit.

4. The power converter according to claim 3, wherein the power module has a first terminal, a second terminal, and a third terminal, the primary switch circuit is coupled between the first terminal and the third terminal and is connected to the absorption capacitor in parallel, two terminals of the primary winding of the magnetic component are electrically connected to the switch midpoint and the second terminal respectively, a first terminal of the first capacitor and a first terminal of the second capacitor are electrically connected to a first capacitor midpoint, the first capacitor midpoint is electrically connected to the second terminal of the power module, a second terminal of the first capacitor is electrically connected to the first terminal of the power module, and a second terminal of the second capacitor is electrically connected to the third terminal of the power module.

5. The power converter according to claim 4, wherein the absorption capacitor comprises a first absorption capacitor and a second absorption capacitor connected in series, there is a second capacitor midpoint between the first absorption capacitor and the second absorption capacitor, and the second capacitor midpoint is electrically connected to the second terminal of the power module.

6. The power converter according to claim 4, wherein the power converter comprises a plurality of said power modules, a plurality of said first terminals of the plurality of power modules are electrically connected to each other, a plurality of said second terminals of the plurality of power modules are electrically connected to each other, and a plurality of said third terminals of the plurality of power modules are electrically connected to each other.

7. The power converter according to claim 1, wherein the secondary winding of the magnetic component has two first terminals and a second terminal, the secondary circuit comprises a first rectifier component and a second rectifier component, the first rectifier component is electrically connected between one of the two first terminals and a negative output terminal of the power converter, the second rectifier component is electrically connected between the other one of the two first terminal and the negative output terminal, the second terminal is electrically connected to a positive output terminal of the power converter, and each of the first rectifier component and the second rectifier component comprises at least one rectifier component.

8. The power converter according to claim 7, wherein the secondary circuit further comprises an output capacitor coupled between the positive output terminal and the negative output terminal.

9. The power converter according to claim 1, wherein the magnetic component comprises:
at least one magnetic core assembly, comprising:
a first magnetic cover and a second magnetic cover; and
a first magnetic pillar, a second magnetic pillar, a third magnetic pillar, and a fourth magnetic pillar, wherein the first magnetic pillar and the third magnetic pillar are disposed between the first magnetic cover and the second magnetic cover and are opposite to each other, the second magnetic pillar and the fourth magnetic pillar are disposed between the first magnetic cover and the second magnetic cover and are opposite to each other, the first magnetic pillar and the third magnetic pillar are located between the second magnetic pillar and the fourth magnetic pillar, reluctances of the second magnetic pillar and the fourth magnetic pillar are larger than reluctances of the first magnetic pillar and the third magnetic pillar respectively, a connection region is defined by the first magnetic pillar, the second magnetic pillar, the third magnetic pillar, and the fourth magnetic pillar collaboratively therebetween;
a primary winding, wound around the first magnetic pillar and the third magnetic pillar through the connection region, wherein magnetic fluxes on the first magnetic pillar and the third magnetic pillar are opposite in direction; and
a first secondary winding and a second secondary winding, wherein a first terminal of the first secondary winding passes through a space between the first magnetic pillar and the second magnetic pillar, a second terminal of the first secondary winding passes through a space between the third magnetic pillar and the fourth magnetic pillar, a first terminal of the second secondary winding passes through a space between the first magnetic pillar and the fourth magnetic pillar, a second terminal of the second secondary winding passes through a space between the second magnetic pillar and the third magnetic pillar, and a part of the first secondary winding and a part of the second secondary winding are located in the connection region.

10. The power converter according to claim 9, wherein the primary winding is crossly wound around the first magnetic pillar and the third magnetic pillar through the connection region with a "∞" shape.

11. The power converter according to claim 9, wherein a length of an air gap on the second magnetic pillar is greater than a length of an air gap on the first magnetic pillar, and a length of an air gap on the fourth magnetic pillar is greater than a length of an air gap on the third magnetic pillar.

12. The power converter according to claim 9, wherein the second magnetic pillar and the fourth magnetic pillar are formed by an iron powder material with air gaps, and the first magnetic pillar and the third magnetic pillar are formed by a ferrite material.

13. The power converter according to claim 1, wherein the magnetic component comprises:
at least one magnetic core assembly, comprising:
a first magnetic cover and a second magnetic cover; and
a first magnetic pillar, a second magnetic pillar, and a third magnetic pillar, disposed between the first magnetic cover and the second magnetic cover, wherein the second magnetic pillar is located between the first magnetic pillar and the third magnetic pillar;
a primary winding, wound around the first magnetic pillar and the third magnetic pillar; and
a first secondary winding and a second secondary winding, wound around the first magnetic pillar and the third magnetic pillar respectively.

14. The power converter according to claim 13, wherein the primary winding is crossly wound around the first magnetic pillar and the third magnetic pillar with a "∞" shape.

15. The power converter according to claim 13, wherein a length of an air gap on the second magnetic pillar is greater than a length of an air gap on the first magnetic pillar and a length of an air gap on the third magnetic pillar.

16. The power converter according to claim 13, wherein the second magnetic pillar is formed by an iron powder material with air gaps, and the first magnetic pillar and the third magnetic pillar are formed by a ferrite material.

17. A power converter, comprising:
a first capacitor and a second capacitor connected in series;
a primary switch circuit, connected to the first capacitor and the second capacitor in parallel; and
a power module, electrically connected to the first capacitor, the second capacitor, and the primary switch circuit, and comprising a circuit board, a magnetic component, and a secondary circuit, wherein the magnetic component and the secondary circuit are disposed on the circuit board, and a primary winding and a secondary winding of the magnetic component are electrically connected to the primary switch circuit and the secondary circuit respectively,
wherein the first capacitor and the second capacitor are disposed separately from the power module.

18. The power converter according to claim 17, further comprising a substrate, wherein the first capacitor, the second capacitor, the primary switch circuit and the power module are disposed on the substrate, and the power module is electrically connected to the first capacitor, the second capacitor, and the primary switch circuit through the substrate.

19. The power converter according to claim 17, further comprising a substrate and an additional circuit board, wherein the first capacitor, the second capacitor, and the primary switch circuit are disposed on the additional circuit board, and the additional circuit board and the power module are disposed on the substrate.

20. The power converter according to claim 17, wherein the primary switch circuit comprises two switches connected in series, there is a switch midpoint between the two switches, and the primary switch circuit, the first capacitor, and the second capacitor form a half-bridge circuit.

21. The power converter according to claim 20, wherein the power module has a first terminal and a second terminal, two terminals of the primary winding of the magnetic component are electrically connected to the first terminal and the second terminal respectively, a first terminal of the first capacitor and a first terminal of the second capacitor are electrically connected to a capacitor midpoint, and the switch midpoint and the capacitor midpoint are electrically connected to the first terminal and the second terminal of the power module respectively.

22. The power converter according to claim 21, wherein the power converter comprises a plurality of said power modules, a plurality of said first terminals of the plurality of power modules are electrically connected to each other, and a plurality of said second terminals of the plurality of power modules are electrically connected to each other.

23. The power converter according to claim 17, wherein the secondary winding of the magnetic component has two first terminals and a second terminal, the secondary circuit comprises a first rectifier component and a second rectifier component, the first rectifier component is electrically connected between one of the two first terminals and a negative output terminal of the power converter, the second rectifier component is electrically connected between the other one of the two first terminal and the negative output terminal, the second terminal is electrically connected to a positive output terminal of the power converter, and each of the first rectifier component and the second rectifier component comprises at least one rectifier component.

24. The power converter according to claim 23, wherein the secondary circuit further comprises an output capacitor coupled between the positive output terminal and the negative output terminal.

25. The power converter according to claim 17, wherein the magnetic component comprises:
at least one magnetic core assembly, comprising:
a first magnetic cover and a second magnetic cover; and
a first magnetic pillar, a second magnetic pillar, a third magnetic pillar, and a fourth magnetic pillar, wherein the first magnetic pillar and the third magnetic pillar are disposed between the first magnetic cover and the second magnetic cover and are opposite to each other, the second magnetic pillar and the fourth magnetic pillar are disposed between the first magnetic cover and the second magnetic cover and are opposite to each other, the first magnetic pillar and the third magnetic pillar are located between the second magnetic pillar and the fourth magnetic pillar, reluctances of the second magnetic pillar and the fourth magnetic pillar are larger than reluctances of the first magnetic pillar and the third magnetic pillar respectively, a connection region is defined by the first magnetic pillar, the second magnetic pillar, the third magnetic pillar, and the fourth magnetic pillar collaboratively therebetween;
a primary winding, wound around the first magnetic pillar and the third magnetic pillar through the connection region, wherein magnetic fluxes on the first magnetic pillar and the third magnetic pillar are opposite in direction; and
a first secondary winding and a second secondary winding, wherein a first terminal of the first secondary winding passes through a space between the first magnetic pillar and the second magnetic pillar, a second terminal of the first secondary winding passes through a space between the third magnetic pillar and the fourth magnetic pillar, a first terminal of the second secondary winding passes through a space between the first magnetic pillar and the fourth magnetic pillar, a second terminal of the second secondary winding passes through a space between the second magnetic pillar and the third magnetic pillar, and a part of the first secondary winding and a part of the second secondary winding are located in the connection region.

26. The power converter according to claim 25, wherein the primary winding is crossly wound around the first magnetic pillar and the third magnetic pillar through the connection region with a "∞" shape.

27. The power converter according to claim 25, wherein a length of an air gap on the second magnetic pillar is greater than a length of an air gap on the first magnetic pillar, and a length of an air gap on the fourth magnetic pillar is greater than a length of an air gap on the third magnetic pillar.

28. The power converter according to claim 25, wherein the second magnetic pillar and the fourth magnetic pillar are formed by an iron powder material with air gaps, and the first magnetic pillar and the third magnetic pillar are formed by a ferrite material.

29. The power converter according to claim 17, wherein the magnetic component comprises:
at least one magnetic core assembly, comprising:
a first magnetic cover and a second magnetic cover; and
a first magnetic pillar, a second magnetic pillar, and a third magnetic pillar, disposed between the first magnetic cover and the second magnetic cover, wherein the second magnetic pillar is located between the first magnetic pillar and the third magnetic pillar;
a primary winding, wound around the first magnetic pillar and the third magnetic pillar; and
a first secondary winding and a second secondary winding, wound around the first magnetic pillar and the third magnetic pillar respectively.

30. The power converter according to claim 29, wherein the primary winding is crossly wound around the first magnetic pillar and the third magnetic pillar with a "∞" shape.

31. The power converter according to claim 29, wherein a length of an air gap on the second magnetic pillar is greater than a length of an air gap on the first magnetic pillar and a length of an air gap on the third magnetic pillar.

32. The power converter according to claim 29, wherein the second magnetic pillar is formed by an iron powder material with air gaps, and the first magnetic pillar and the third magnetic pillar are formed by a ferrite material.

* * * * *